US007924112B2

(12) United States Patent
Liu et al.

(10) Patent No.: US 7,924,112 B2
(45) Date of Patent: Apr. 12, 2011

(54) BALUN

(75) Inventors: Ching-Hung Liu, Taichung County (TW); Chen-Chung Liu, Hsinchu (TW); Keng-Hong Wang, Tainan County (TW)

(73) Assignee: Cyntec Co., Ltd., Hsinchu (TW)

( * ) Notice: Subject to any disclaimer, the term of this patent is extended or adjusted under 35 U.S.C. 154(b) by 196 days.

(21) Appl. No.: 12/196,814

(22) Filed: Aug. 22, 2008

(65) Prior Publication Data

US 2009/0295495 A1 Dec. 3, 2009

(30) Foreign Application Priority Data

May 29, 2008 (TW) ............................... 97119950 A

(51) Int. Cl.
*H03H 7/42* (2006.01)
*H01P 3/08* (2006.01)

(52) U.S. Cl. .......................................... 333/26; 333/238

(58) Field of Classification Search .................... 333/25, 333/26, 238
See application file for complete search history.

(56) References Cited

U.S. PATENT DOCUMENTS 4,755,775 A 7/1988 Marczewski et al.
5,497,137 A 3/1996 Fujiki
6,097,273 A * 8/2000 Frye et al. ..................... 336/200
6,380,821 B1 * 4/2002 Imbornone et al. ............. 333/25
6,515,556 B1 * 2/2003 Kato et al. .................... 333/116
7,511,591 B2 * 3/2009 Ezzendine ...................... 333/26

FOREIGN PATENT DOCUMENTS

JP 61-21601 1/1986
JP 2002050910 2/2002
JP 2004-320561 11/2004
JP 2006-025237 1/2006

* cited by examiner

*Primary Examiner* — Dean O Takaoka

(57) ABSTRACT

A balun includes a first, second, and third metallic layers, a first dielectric layer disposed between the second and third metallic layers, and a dielectric substrate. The second metallic layer includes a first spiral line having sequentially connected first line segments and a second spiral line having sequentially connected second line segments. A first distance between each two opposite sides of a first region encircled by the innermost first line segments is greater than a second distance between each two adjacent parallel first line segments. A third distance between each two opposite sides of a second region encircled by the innermost second line segments is greater than a fourth distance between each two adjacent parallel second line segments. The third metallic layer includes a third and a fourth spiral lines. The first metallic layer and other elements as a whole are disposed on an opposite surface of the dielectric substrate.

20 Claims, 17 Drawing Sheets

BALUN

CROSS-REFERENCE TO RELATED APPLICATION

This application claims the priority benefit of Taiwan application serial no. 97119950, filed May 29, 2008. The entirety of the above-mentioned patent application is hereby incorporated by reference herein and made a part of this specification.

BACKGROUND OF THE INVENTION

1. Field of the Invention

The present invention generally relates to a balun, and more particularly, to a balun including a plurality of metallic layers.

2. Description of Related Art

A balun (balanced-unbalanced transformer) is a device for transforming a balanced signal to an unbalanced signal or transforming an unbalanced signal to a balanced signal. The balanced signal is made up of two signals that are nearly 180 degrees out of phase with each other and have nearly equal amplitudes. The balun usually has two balanced terminals for receiving and outputting balanced signals and one unbalanced terminal for receiving and outputting unbalanced signals.

As shown in FIGS. 1A and 1B, U.S. Pat. No. 5,497,137 discloses a conventional balun 100 having a thin layer laminate 100*a*. The thin layer laminate 100*a* includes an earth electrode 110*a*, a connecting electrode 110*b*, a first strip line 110*c*, a second strip line 110*d*, an earth electrode 110*e*, a first dielectric substrate 120*a*, a second dielectric substrate 120*b*, a third dielectric substrate 120*c*, a fourth dielectric substrate 120*d*, and a fifth dielectric substrate 120*e*.

When fabricating such the laminate 100*a*, firstly the earth electrode 110*a* is formed on the first dielectric substrate 120*a*; the connecting electrode 110*b* is formed on the second dielectric substrate 120*b*; the first strip line 110*c* is formed on the third dielectric substrate 120*c*; the second strip line 110*d* is formed on the fourth dielectric substrate 120*d*; and the earth electrode 110*e* is formed on the fifth dielectric substrate 120*e*. Subsequently, the substrates are superimposed to configure the laminate 110*a*. Because the laminate 110*a* is configured by a superimposing process, each of the electrodes and the strip lines demands a dielectric substrate corresponding thereto, and thus the laminate 100*a* is relatively thick and has many layers.

The first strip line 110*c* includes a first spiral line 112 and a second spiral line 114 which are connected to each other. The first spiral line 112 has a width 112*a* smaller than a width 114*a* of the second spiral line 114. An inner end of the first spiral line 112 is electrically connected to the connecting electrode 110*b* via a conductive via 130*a* configured through the second dielectric substrate 120*b*. An inner end of the second spiral line 114 is an open-circuited end.

The second strip line 110*d* includes a third spiral line 116 and a fourth spiral line 118 which are independently provided. The third spiral line 116 corresponds to the first spiral line 112, and the fourth spiral line 118 corresponds to the second spiral line 114. An inner end of the third spiral line 116 is electrically connected to the earth electrode 110*e* via a conductive via 130*b* configured though the fourth dielectric substrate 120*d*. An inner end of the fourth spiral line 118 is electrically connected to the earth electrode 110*e* via another conductive via 130*c* configured through the fourth dielectric substrate 120*d*.

The balun 100 further includes eight external electrodes 140*a*, 140*b*, 140*c*, 140*d*, 140*e*, 140*f*, 140*g*, and 140*h*, configured at side surfaces of the laminate 110*a*. The external electrodes 140*a*, 140*d*, 140*e*, and 140*h* are electrically connected to the earth electrodes 110*a*, 110*e*. The external electrode 140*b* is electrically connected to an outer end of the third spiral line 116. The external electrode 140*c* is electrically connected to an outer end of the fourth spiral line 118, and the external electrode 140*f* is electrically connected to an end of the connecting electrode 110*b* which is far from the conductive via 130*a*.

Referring to FIGS. 1B and 1C, a distance between each two opposite sides of an innermost circle of the first spiral line 112 is defined as a first distance 112*b*, and a distance between each two adjacent parallel line segments of the first spiral line 112 is defined as a second distance 112*c*. Each of the second distance 112*c* is approximately equivalent to one of the first distances 112*b*. A distance between each two opposite sides of an innermost circle of the second spiral line 114 is defined as a third distance 114*b*, and a distance between each two adjacent parallel line segments of the second spiral line 114 is defined as a fourth distance 114*c*. Each of the third distance 114*c* is approximately equivalent to one of the fourth distances 114*b*. As such, while the external electrode 140*f* serves as an input electrode and the external electrodes 140*b*, 140*c* serve as output electrodes, the balun 100 has higher return loss and insertion loss. Further, the conventional balun 100 has a poor quality factor Q. Briefly, the conventional balun 100 has a poor electrical performance.

SUMMARY OF THE INVENTION

Accordingly, the present invention is directed to provide a balun for obtaining a better quality factor Q and achieving an improved overall electrical performance by reducing return loss and insertion loss.

The present invention is further directed to provide a balun having a smaller thickness and fewer layers.

The present invention is also directed to provide a balun having a wider signal frequency bandwidth.

The present invention is still directed to provide a balun having a better magnetic coupling efficiency.

The present invention is still further directed to provide a balun having an arc corner segment, which is adapted for producing less signal loss when transmitting signals.

The present invention provides a balun, including a first metallic layer, a second metallic layer, a third metallic layer, a first dielectric layer, and a dielectric substrate. The first metallic layer includes a first conductive portion. The second metallic layer includes a first spiral line and a second spiral line. The first spiral line includes an unbalanced I/O end, a first connection end, and a plurality of sequentially connected first line segments. The innermost first line segments encircle a first region. Each two opposite sides of the first region are apart from each other for a first distance, and each two adjacent parallel first line segments are apart from each other for a second distance. Each second distance is smaller than each first distance. The second spiral line includes a second connection end electrically connected to the first connection end, an open-circuit end, and a plurality of sequentially connected second line segments. The innermost second line segments encircle a second region. Each two opposite sides of the second region are apart from each other for a third distance, and each two adjacent parallel second line segments are apart from each other for a fourth distance. Each fourth distance is smaller than each third distance.

The third metallic layer includes a third spiral line and a fourth spiral line. The third spiral line corresponds to the first spiral line and includes a first balanced I/O end and a third connection end electrically connected to the first conductive portion. The fourth spiral line corresponds to the second spiral line and includes a second balanced I/O end and a fourth connection end electrically connected to the first conductive portion. The first dielectric layer is disposed between the second metallic layer and the third metallic layer. The dielectric substrate includes a first surface and a second surface opposite one to another. The first metallic layer is disposed on the first surface, and the second metallic layer, the third metallic layer and the first dielectric layer are disposed on the second surface.

The first metallic layer, the second metallic layer, the third metallic layer, and the first dielectric layer are fabricated by thin film processing. Each of the first line segments has a width between 15 μm and 30 μm, and each of the second line segments has a width between 15 μm and 30 μm. The first dielectric layer has a thickness between 8 μm and 12 μm.

The first spiral line further includes a plurality of first arc corner segments. Each of the first arc corner segments connects two of the first line segments. The second spiral line includes a plurality of second arc corner segments. Each of the second arc corner segments connects two of the second line segments.

The third spiral line includes a plurality of sequentially connected third line segments. The innermost third line segments encircle a third region. Each two opposite sides of the third region are apart from each other for a fifth distance, and each two adjacent parallel third line segments are apart from each other for a sixth distance. Each sixth distance is smaller than each fifth distance. The fourth spiral line includes a plurality of sequentially connected fourth line segments. The innermost fourth line segments encircle a fourth region. Each two opposite sides of the fourth region are apart from each other for a seventh distance, and each two adjacent parallel fourth line segments are apart from each other for an eighth distance. Each eighth distance is smaller than each seventh distance. Further, each of the third line segments has a width between 15 μm and 30 μm, and each of the fourth line segments has a width between 15 μm and 30 μm. The third spiral line further includes a plurality of third arc corner segments. Each of the third arc corner segments connects two of the third line segments. The fourth spiral line further includes a plurality of fourth arc corner segments. Each of the fourth arc corner segments connects two of the fourth line segments.

The balun further includes a fourth metallic layer and a second dielectric layer. The second dielectric layer is disposed between the fourth metallic layer and the second metallic layer, or between the fourth metallic layer and the third metallic layer. The fourth metallic layer includes a fifth line segment and a plurality of sixth line segments. The first connection end of the first spiral line is electrically connected to the second connection end of the second spiral line via the fifth line segment. The third spiral line is electrically connected to the first conductive portion via one of the sixth line segments. The fourth spiral line is electrically connected to the first conductive portion via another one of the sixth line segments.

The first metallic layer is made of copper (Cu). The second metallic layer includes a first sub-metallic layer made of Cu and a second sub-metallic layer made of nickel-chromium (Ni—Cr) alloy. The third metallic layer includes a third sub-metallic layer made of Cu and a fourth sub-metallic layer made of Ni—Cr alloy.

An outermost circle of the first spiral line defines a fifth region. An outermost circle of the second spiral line defines a sixth region. An outermost circle of the third spiral line defines a seventh region. An outermost circle of the fourth spiral line defines an eighth region. The fifth region, the sixth region, the seventh region, and the eighth region are configured with rectangular shapes or square shapes.

The balun is further connected with a capacitor. The first conductive portion includes a direct current (DC) feed-in end and a fifth connection end. The fifth connection end is electrically connected to an end of the capacitor. The other end of the capacitor is grounded.

The first metallic layer further includes a plurality of second conductive portions. The unbalanced I/O end is electrically connected to one of the second conductive portions. The first balanced I/O end is electrically connected to another one of the second conductive portions. The second balanced I/O portion is electrically connected to still another one of the second conductive portions.

Because all of the first metallic layer, the second metallic layer, the third metallic layer, and the first dielectric layer are fabricated by thin film processing, each of the metallic layers does not demand for an independent dielectric substrate. As such, comparing with the conventional laminate, the balun according to the embodiments of the present invention has a smaller thickness and employing fewer layers. Further, within a certain frequency bandwidth, because each second distance is smaller than each first distance and each fourth distance is smaller than each third distance, the return loss and the insertion loss can be reduced while the unbalanced I/O serves as an input electrode and the first balanced I/O and the second balanced I/O serve as output electrodes. Further, the balun according to the embodiments of the present invention can achieve an improved quality factor Q. Briefly, comparing with the conventional balun, the balun according of the present invention has an improved electrical performance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
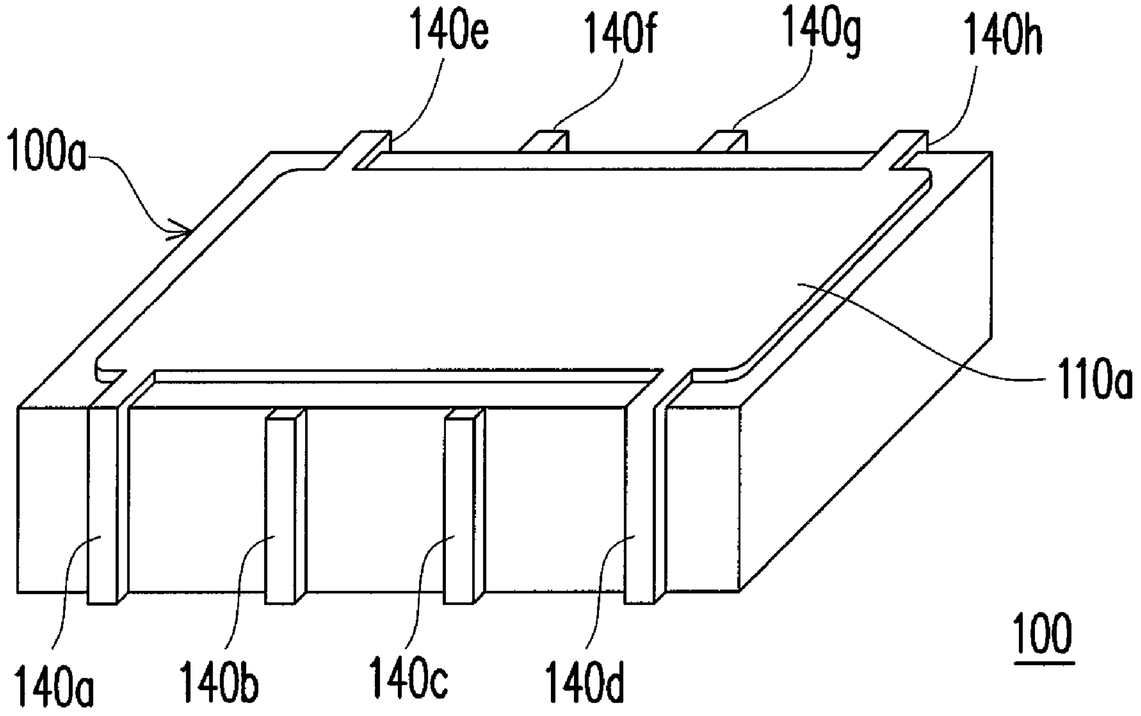
FIG. 1A (PRIOR ART)
FIG. 1A is a perspective schematic view of a conventional balun.

Reference will now be made in detail to the present preferred embodiments of the invention, examples of which are illustrated in the accompanying drawings. Wherever possible, the same reference counting numbers are used in the drawings and the description to refer to the same or like parts.

First Embodiment

Figure 3:
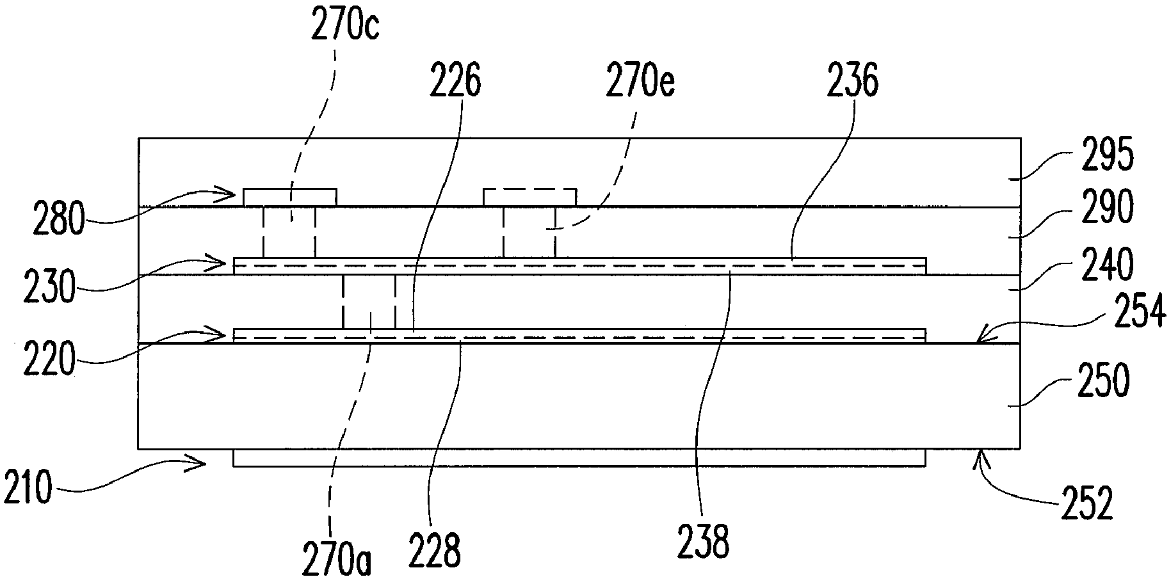
FIG. 3 is a schematic cross-sectional view taken along line I-I of FIG. 2A.
Figure 4A:
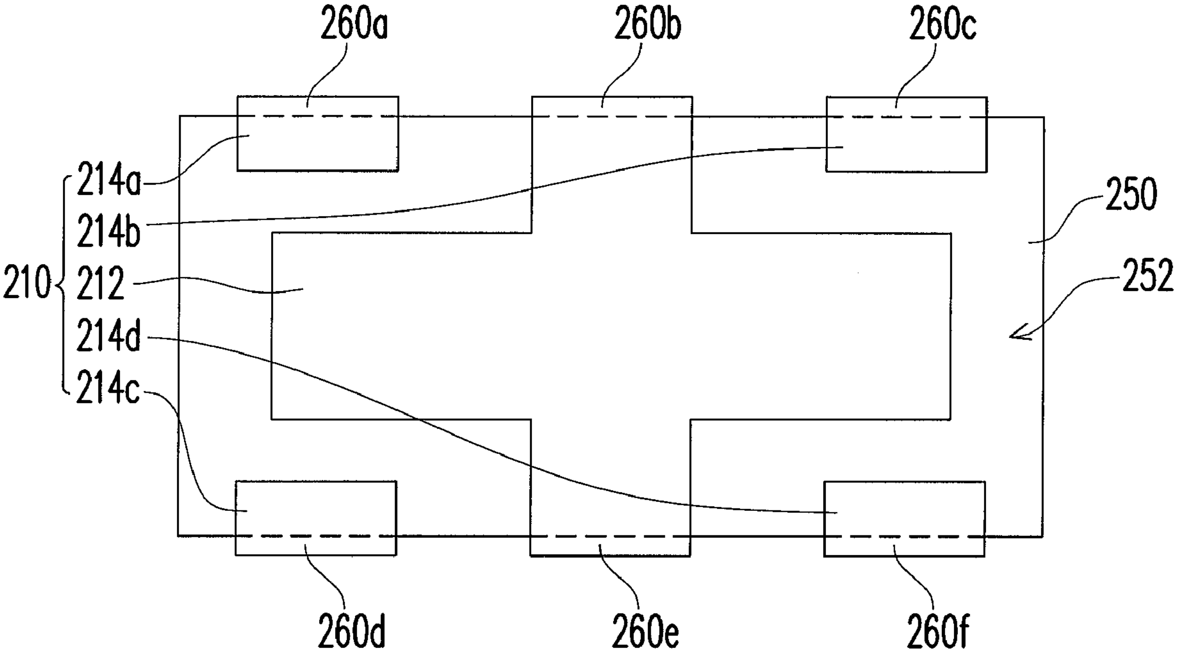
FIGS. 4A through 4G are schematic cross-sectional views taken along lines A-A, B-B, C-C, D-D, E-E, F-F, and G-G of FIG. 2B, respectively.
Figure 4B:
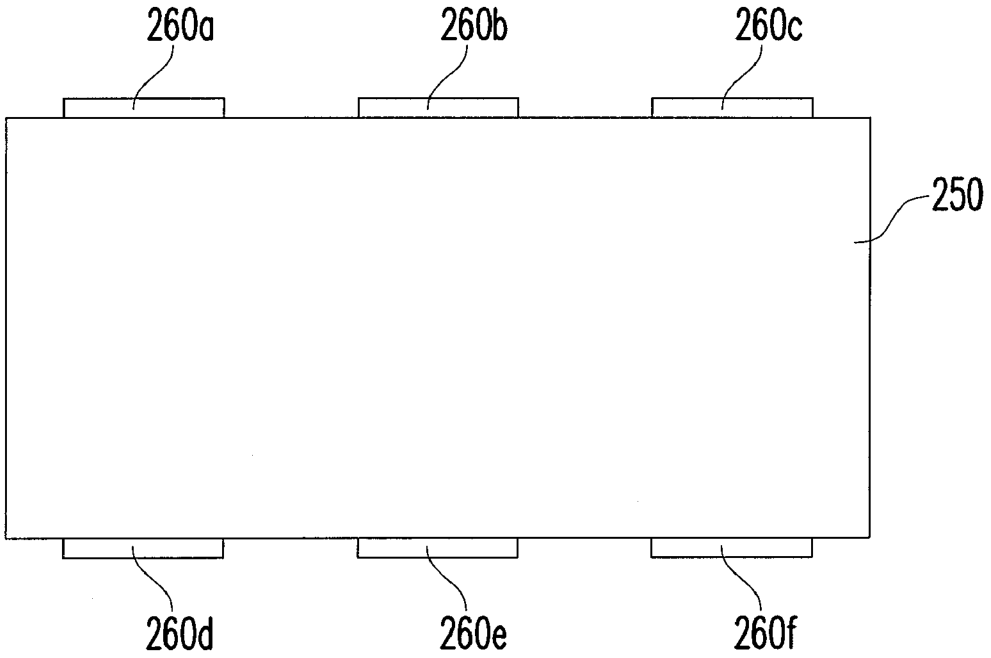
Figure 4C:
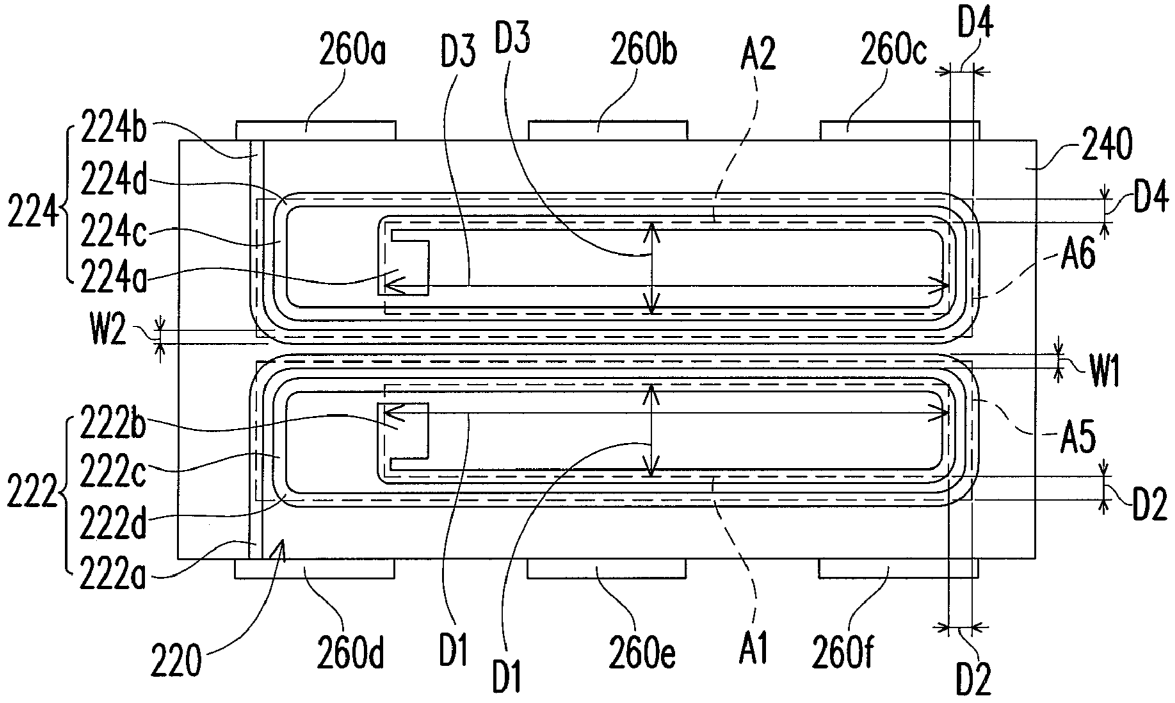
Figure 4D:
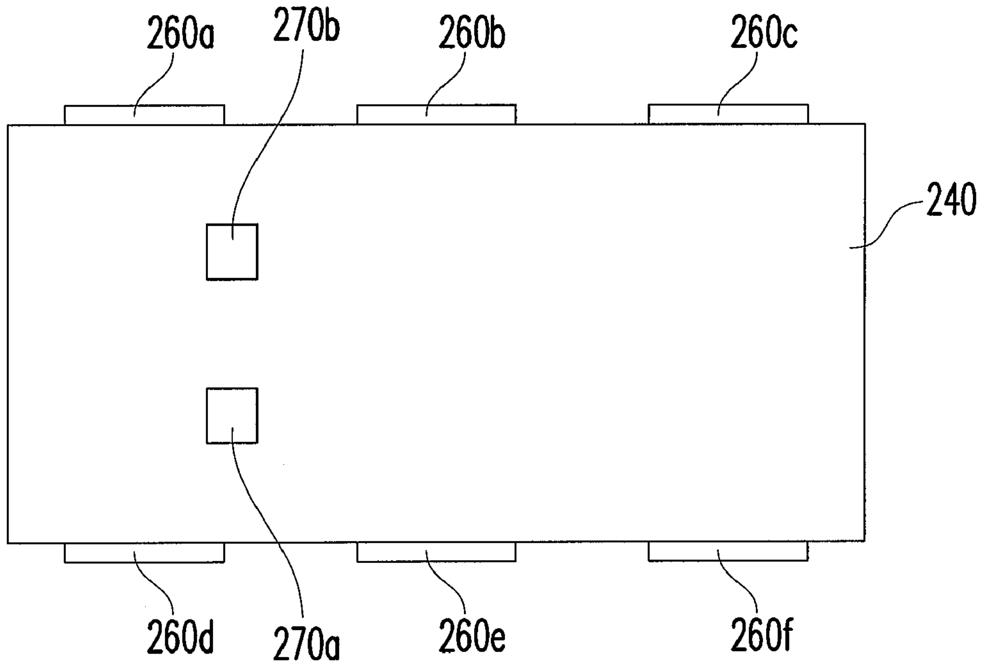
Figure 4E:
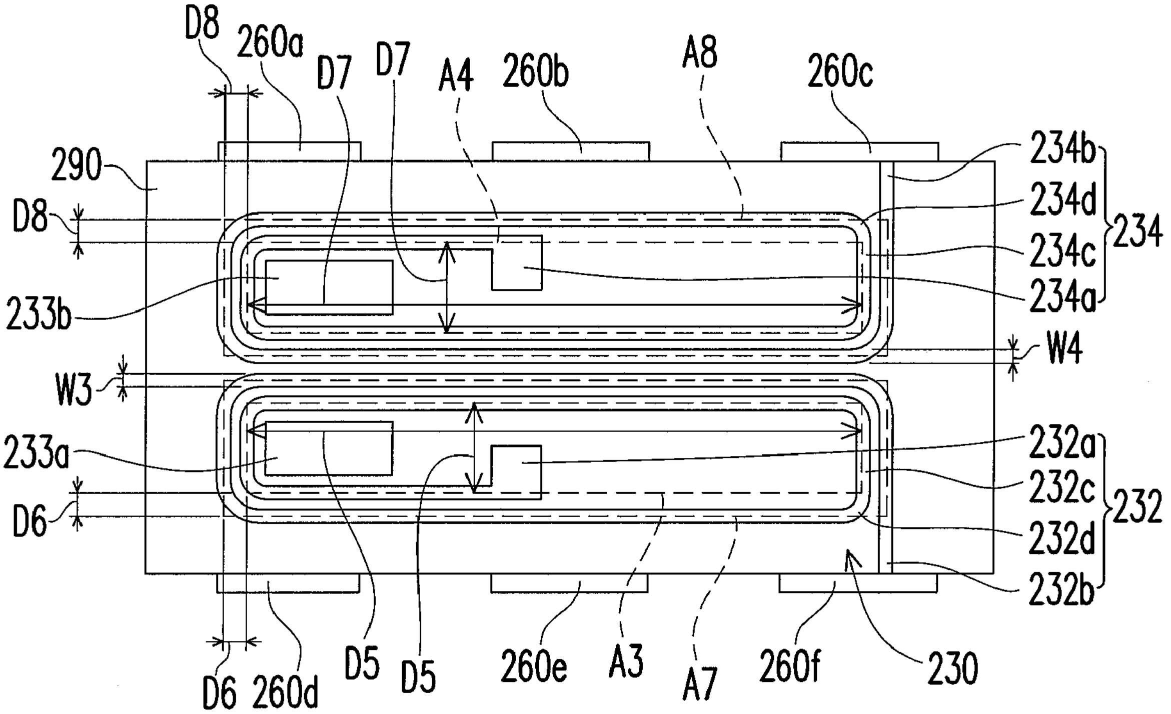
Figure 4F:
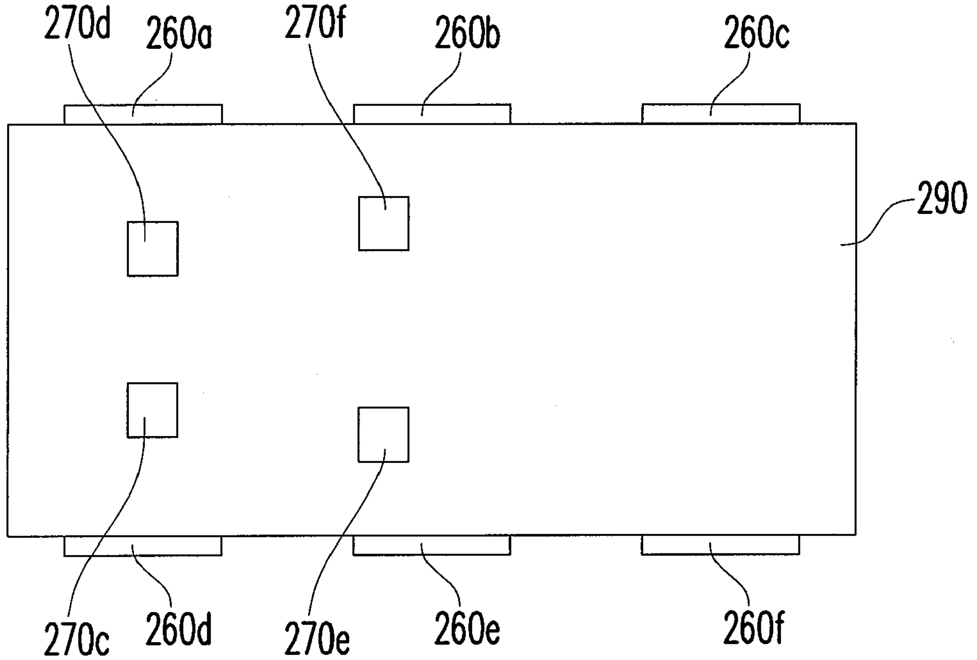

Referring to FIGS. 2A, 2B, 3, and 4A, a balun 200 according to a first embodiment of the present invention includes a first metallic layer 210, a second metallic layer 220, a third metallic layer 230, a first dielectric layer 240, a dielectric substrate 250, a plurality of external electrodes 260*a*, 260*b*, 260*c*, 260*d*, 260*e*, and 260*f*, a plurality of conductive channels 270*a*, 270*b*, 270*c*, 270*d*, 270*e*, and 270*f* (as shown in FIGS. 4D and 4F), a fourth metallic layer 280, a second dielectric layer 290, and a protective layer 295. The first metallic layer 210, the second metallic layer 220, the third metallic layer 230, the first dielectric layer 240, the fourth metallic layer 280, and the second dielectric layer 290 are fabricated by thin film processing and together with the dielectric substrate 250 entirely configure a body 20. The external electrodes 260*a*, 260*b*, 260*c* are disposed at a first side surface 22*a* of the body 20. The external electrodes 260*d*, 260*e*, 260*f* are disposed at a second side surface 22*b* of the body 20. The first side surface 22*a* and the second side surface 22*b* are opposite one to another.

Referring to FIGS. 3 and 4B, the dielectric substrate 250 includes a first surface 252 and a second surface 254 opposite one to another. The first metallic layer 210 is disposed on the first surface 252. The rest elements including the second metallic layer 220, the third metallic layer 230, the first dielectric layer 240, the fourth metallic layer 280, the second dielectric layer 290, and the protective layer 295 are disposed on the second surface 254. The dielectric substrate 250 for example is made of alumina.

Referring to FIG. 4A, the first metallic layer 210 includes a first conductive portion 212, and a plurality of second conductive portions 214*a*, 214*b*, 214*c*, and 214*d*. The first conductive portion 212 is disposed apart from the second conductive portions 214*a*, 214*b*, 214*c*, and 214*d*. The first conductive portion 212 is grounded. The second conductive portion 214*a* is open-circuited. The second conductive portions 214*b*, 214*c*, and 214*d* are provided for transmitting signals. In other words, when the balun 200 is disposed on a circuit board (not shown), the second conductive portion 214*a* serves for supporting and fixing function without transmitting signals. Specifically, the first conductive portion 212 is electrically connected to the external electrodes 260*b* and 260*e*. The second conductive portions 214*a*, 214*b*, 214*c*, and 214*d* are electrically connected to the external electrodes 260*a*, 260*c*, 260*d*, and 260*f*, respectively. The first metallic layer 210 for example is made of copper (Cu).

Referring to FIGS. 3 and 4C, the second metallic layer 220 is disposed on the second surface 254 of the dielectric substrate 250. The second metallic layer 220 includes a first spiral line 222 and a second spiral line 224 which are disposed apart from the first spiral line 222. The first spiral line 222 includes an unbalanced I/O end 222*a*, a first connection end 222*b*, a plurality of sequentially connected first line segments 222*c* disposed between the unbalanced I/O end 222*a* and the first connection end 222*b*, and a plurality of first arc corner segments 222*d*. The unbalanced I/O end 222*a* is an outer end of the first spiral line 222. The first connection end 222*b* is an inner end of the first spiral line 222. As shown in FIG. 4A, the unbalanced I/O end 222*a* is electrically connected to the second conductive portion 214*c* via the external electrode 260*d*. Each first line segment 222*c* has a width W1 between 15 μm and 30 μm. Each of the first arc corner segments 222*d* connects two of the first line segments 222*c*. The innermost first line segments 222*c* encircle a first region A1. Each two opposite sides of the first region A1 are apart from each other for a first distance D1, and each two adjacent parallel first line segments 222*c* are apart from each other for a second distance D2. Each second distance D2 is smaller than each first distance D1. An outermost circle of the firs spiral line 222 defines a fifth region A5 having a rectangular shape.

The second spiral line 224 includes a second connection end 224*a*, an open-circuit end 224*b*, a plurality of sequentially connected second line segments 224*c* disposed between the second connection end 224*a* and the open-circuit end 224*b*, and a plurality of second arc corner segments 224*d*. The open-circuit end 224*b* is an outer end of the second spiral line 224 and the second connection end 224*a* is an inner end of the second spiral line 224. The open-circuit end 224*b* is electrically connected to the second conductive portion 214*a* via the external electrode 260*a*, as shown in FIG. 4A. The open-circuit end 224*b* and the unbalanced I/O end 222*a* are respectively connected to external electrodes 260*a* and 260*d* which are disposed at different side surfaces of the body 20. The second connection end 224*a* is electrically connected to the first connection end 222*b* (to be described herebelow). Each of the second line segments 224*c* has a width W2 between 15 μm and 30 μm. Each of the second arc corner segment 224*d* connects two of the second line segments 224*c*. The innermost second line segments 224*c* encircle a second region A2. Each two opposite sides of the second region A2 are apart from each other for a third distance D3. Each two adjacent parallel second line segments 224*c* are apart from each other for a fourth distance D4. Each fourth distance D4 is smaller than each third distance D3. An outermost circle of the second spiral 224 defines a sixth region A6 having a rectangular shape.

Referring to FIG. 3, a second metallic layer 220 includes a first sub-metallic layer 226 made of Cu and a second sub-metallic layer 228 made of Ni—Cr alloy. The first sub-metallic layer 226 and the second sub-metallic layer 228 together constitute the first spiral line 222 and the second spiral line 224. The first sub-metallic layer 226 is attached to the second surface 254 of the dielectric substrate 250 by the second sub-metallic layer 228.

Referring to FIGS. 3 and 4D, the first dielectric layer 240 is disposed on the second metallic layer 220. The first dielectric layer 240 has a thickness between 8 μm and 12 μm. Referring to FIGS. 4C and 4D, the conductive channels 270*a* and 270*b* are configured through the first dielectric layer 240, and are electrically connected to the first connection end 222*b* of the first spiral line 222 and the second connection end 224*a* of the second spiral line 224, respectively.

Referring to FIGS. 3 and 4E, the third metallic layer 230 is disposed on the first dielectric layer 240. The first dielectric layer 240 is disposed between the second metallic layer 220 and the third metallic layer 230. It should be hereby clarified that positions of the second metallic layer 220 and the third metallic layer 230 of the current embodiment can be exchanged according to practical application, although the exchange is not exactly shown in the drawings. The third metallic layer 230 includes a third spiral line 232 and a fourth spiral line 234 apart from the third spiral line 232. The third spiral line 232 includes a third connection end 232*a*, a first balanced I/O end 232*b*, a plurality of sequentially connected third line segments 232*c* disposed between the third connection end 232*a* and the first balanced I/O end 232*b* and a plurality of third arc corner segments 232*d*. The third connection end 232*a* is an inner end of the third spiral line 232, and the first balanced I/O end 232*b* is an outer end of the third spiral line 232. The third spiral line 232 and the first spiral line 222 (as shown in FIG. 4C) are positionally corresponded to each other. The third connection end 232*a* is electrically connected to the first conductive portion 212 (to be further discussed below). The first balanced I/O end 232*b* is electrically connected to the second conductive portion 214*d* via the external electrode 260*f* (as shown in FIG. 4A). Each of the third line segments 232*c* has a width W3 between 15 μm and 30 μm. Each of the third arc corner segments 232*d* connects two of the third line segments 232*c*. The innermost third line segments 232*c* encircle a third region A3. Each two opposite sides of the third region A3 are apart from each other for a fifth distance D5. Each two adjacent parallel third line segments 232*c* are apart from each other for a sixth distance D6. Each sixth distance D6 is smaller than each fifth distance D5. An outermost circle of the third spiral line 232 defines a seventh region A7 having a rectangular shape.

The fourth spiral line 234 includes a fourth connection end 234*a*, a second balanced I/O end 234*b*, a plurality of sequentially connected fourth line segments 234*c* disposed between the fourth connection end 234*a* and the second balanced I/O end 234*b*, and a plurality of arc corner segment 234*d*. The fourth connection end 234*a* is an inner end of the fourth spiral line 234. The second balanced I/O end 234*b* is an outer end of the fourth spiral line 234. The fourth spiral line 234 and the second spiral line 224 (as shown in FIG. 4C) are positionally corresponded one to another. The fourth connection end 234*a* is electrically connected to the first conductive portion 212 (as discussed below). The second balanced I/O end 234*b* is electrically connected to the second conductive portion 214*b* via the external electrode 260*c* (as shown in FIG. 4A). The second balanced I/O end 234*b* and the first balanced I/O end 232*b* are connected with the external electrodes 260*c* and 260*f* which are disposed at different sides of the body 20, respectively. Each of the fourth line segments 234*c* has a width W4 between 15 μm and 30 μm. Each of the fourth arc corner segments 234*d* connects two of the third line segments 234*c*. The innermost fourth line segments 234*c* encircle a fourth region A4. Each two opposite sides of the fourth region A4 are apart from each other for a seventh distance D7. Each two adjacent parallel fourth line segments 234*c* are apart from each other for an eighth distance D8. Each eighth distance D8 is smaller than each seventh distance D7. An outermost circle of the fourth spiral line 234 defines an eighth region A8 having a rectangular shape.

Referring to FIG. 4E, the third metallic layer 230 further includes two conductive trace lines 233*a* and 233*b*. The conductive trace lines 233*a* and 233*b* are electrically connected to the conductive channels 270*a* and 270*b*, respectively. The conductive trace lines 233*a* and 233*b* are encircled by the third spiral line 232 and the fourth spiral line 234 respectively and positioned above the conductive channels 270*a* and 270*b*, respectively. Areas of the conductive trace lines 233*a* and 233*b* are larger than areas of the conductive channels 270*a* and 270*b*. Referring to FIG. 3, the third metallic layer 230 includes a third sub-metallic layer 236 made of Cu, and a fourth sub-metallic layer 238 made of Ni—Cr alloy. The third sub-metallic layer 236 and the fourth sub-metallic layer 238 together constitute the third spiral line 232, the fourth spiral line 234, and the two conductive trace lines 233*a*, 233*b*. The third sub-metallic layer 236 is attached to the first dielectric layer 240 by the fourth sub-metallic layer 238.

Referring to FIGS. 3 and 4F, the second dielectric layer 290 is disposed on the third metallic layer 230, and has a thickness between 8 μm and 12 μm. The conductive channels 270*c*, 270*d*, 270*e*, 270*f* are configured through the second dielectric layer 290. The conductive channels 270*c* and 270*d* are respectively electrically connected to the conductive trace lines 233*a* and 233*b*. The conductive channels 270*e* and 270*f* are respectively electrically connected to the third connection end 232*a* of the third spiral line 232 and the fourth connection end 234*a* of the fourth spiral line 234.

Figure 4G:
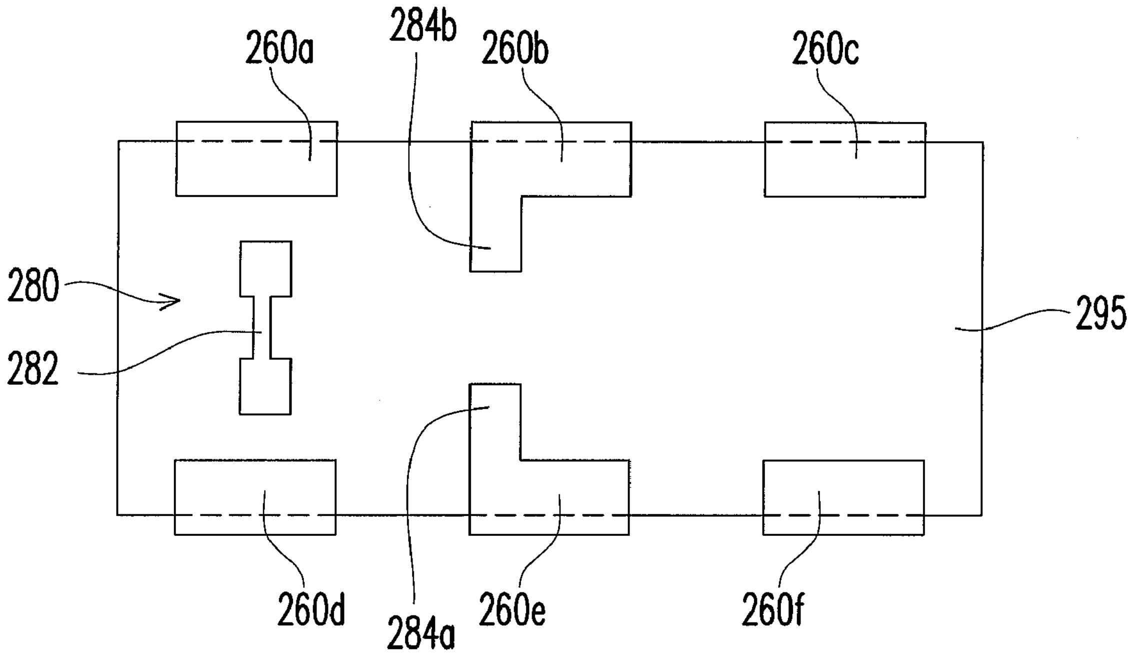

Referring to FIGS. 3 and 4G, the fourth metallic layer 280 is disposed on the second dielectric layer 290. The second dielectric layer 290 is disposed between the fourth metallic layer 280 and the third metallic layer 230. The fourth metallic layer includes a fifth line segment 282, and a plurality of sixth line segments 284*a* and 284*b*. The protective layer 295 is disposed on the second dielectric layer 290 and covers the fourth metallic layer 280, for protecting the fourth metallic layer 280. The fifth line segment 282 is electrically connected with the conductive channels 270*c* and 270*d*. The sixth line segment 284*a* is electrically connected to the conductive channel 270*e* and the external electrode 260*e*. The sixth line segment 284*b* is electrically connected to the conductive channel 270*f* and the external electrode 260*b*. Specifically, the first connection end 222*b* of the first spiral line 222 is electrically connected to the second connection end 224*a* of the second spiral line 224 via the conductive channel 270*a*, the conductive trace line 233*a*, the conductive channel 270*c*, the fifth line segment 282, the conductive channel 270*d*, the conductive trace line 233*b*, and the conductive channel 270*b*. The third connection end 232*a* of the third spiral line 232 is electrically connected to the first conductive portion 212 via the conductive channel 270*e*, the sixth line segment 284*a*, and the external electrode 260*e*. The fourth connection end 234*a* of the fourth spiral line 234 is electrically connected to the first conductive portion 212 via the conductive channel 270*f*, the sixth line segment 284, and the external electrode 260*b*.

Figure 5:
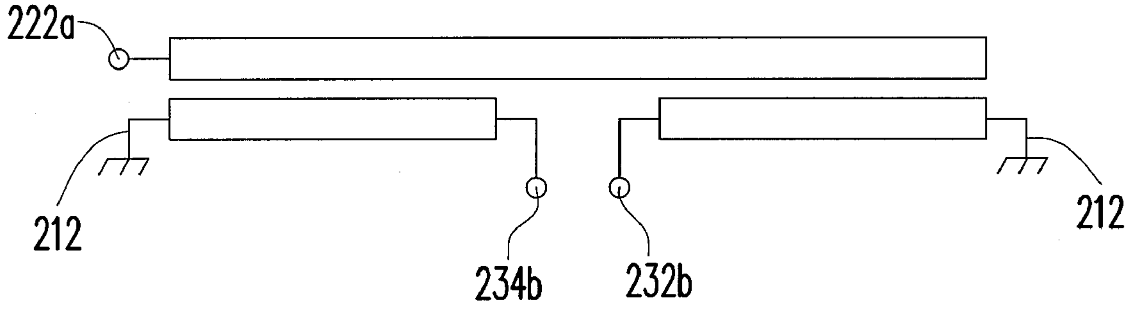
FIG. 5 is an equivalent circuit diagram of the balun according to the first embodiment of the present invention.
Figure 6:
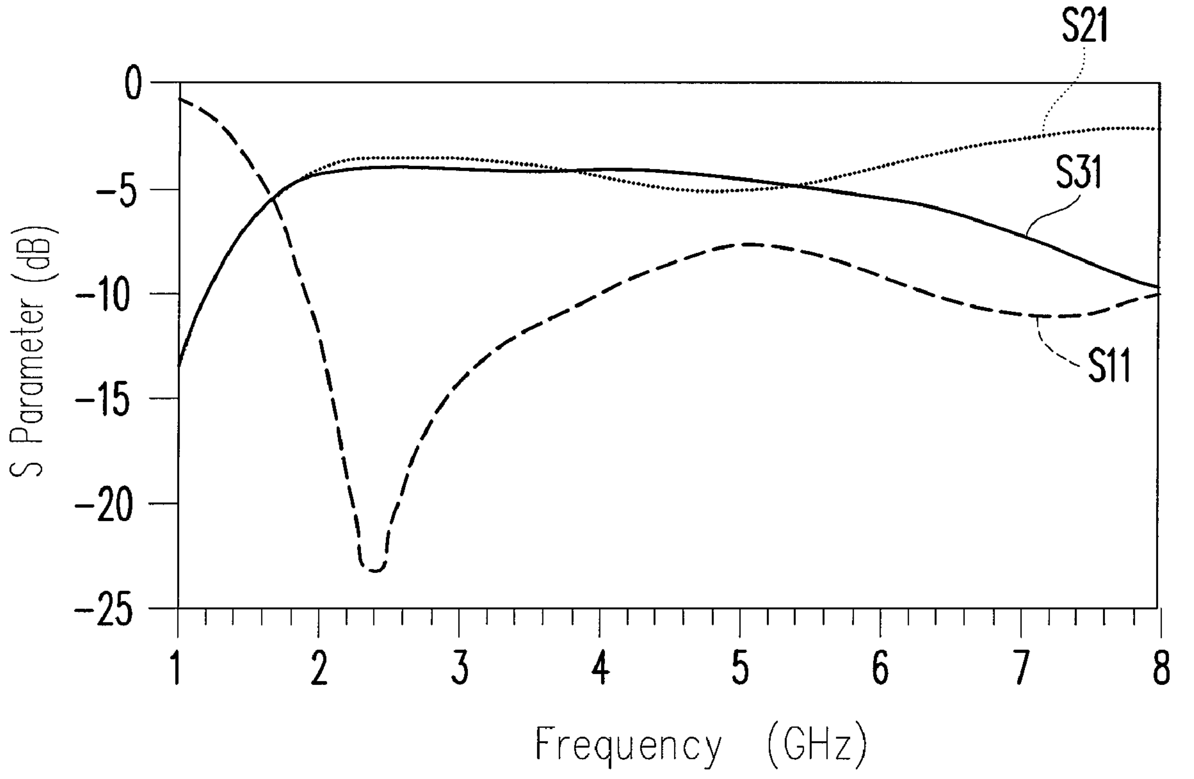
FIG. 6 is a diagram illustrating a frequency vs. S factor relationship when the balun of the first embodiment is in operation.

Referring to FIGS. 5 and 6, for convenience of illustration, the unbalanced I/O end 222*a* is taken as an input end, the first balanced I/O end 232*b* and the second balanced I/O end 234*b* are taken as output ends. S11 represents a return loss, and S21, S31 represent insertion losses. Specifically, S11 represents a logarithm value of a reflective power measured from the unbalanced I/O end 222*a* divided by an input power measured therefrom, that is log (reflective power of the unbalanced I/O end 222*a*/input power of the unbalanced I/O end 222*a*). S21 represents a logarithm value of an output power measured from the second balanced I/O end 234*b* divided by the input power measured from the unbalanced I/O end 222*a*, that is log (output power of the second balanced I/O end 234*b*/input power of the unbalanced I/O end 222*a*). S31 represents a logarithm value of an output power measured from the first balanced I/O end 232*b* divided by the input power measured from the unbalanced I/O end 222*a*, that is log (output power of the first balanced I/O end 232*b*/input power of the unbalanced I/O end 222*a*). A smaller reflective power of the unbalanced I/O end 222*a* (S11 is farther from 0) represents a better return loss performance. Output powers of the balanced I/O ends 232*b*, 234*b* approximate to input power of the unbalanced I/O end 222*a* (S21, S31 are more approximate to 0), represent a better insertion loss performance. It can be learnt from FIG. 6, within a frequency bandwidth range from 2.1 GHz to 3 GHz, S11 is more farther from 0 than other frequency bandwidth ranges, and S21, S31 are more approximate to 0 than other frequency bandwidth ranges. As such, within the frequency bandwidth range from 2.1 GHz to 3 GHz, the unbalanced I/O end 222*a* has a better return loss performance, and the balanced I/O ends 232*b*, 234*b* has a better insertion loss performance. It is so because each second distance D2 is smaller than each first distance D1, and each fourth distance D4 is smaller than each third distance D3, so that the return loss of the unbalanced I/O end 222*a* is decreased, the insertion loss of the first balanced I/O end 232*b* relative to the unbalanced I/O end 222*a* is decreased, and the insertion loss of the second balanced I/O end 234*b* relative to the unbalanced I/O end 222*a* is decreased. Further, the balun 200 according to the embodiment of the present invention has an optimal quality factor Q. Generally, comparing with the conventional balun 100, the balun 200 of the current embodiment has an improved electrical performance.

Figure 1B:
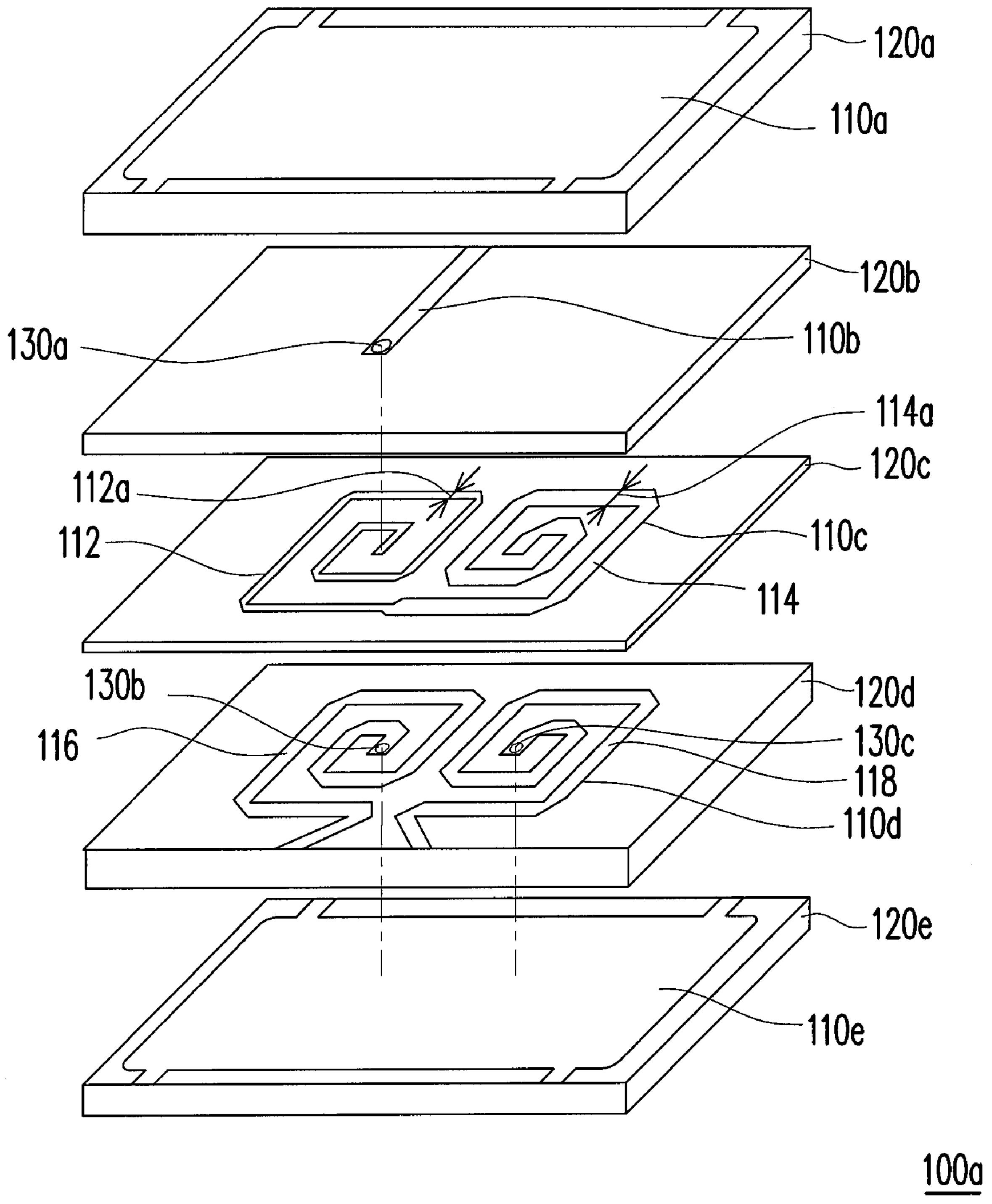
FIG. 1B (PRIOR ART)
FIG. 1B is an exploded perspective schematic view of a thin film laminate of the balun of FIG. 1A.
Figure 1C:
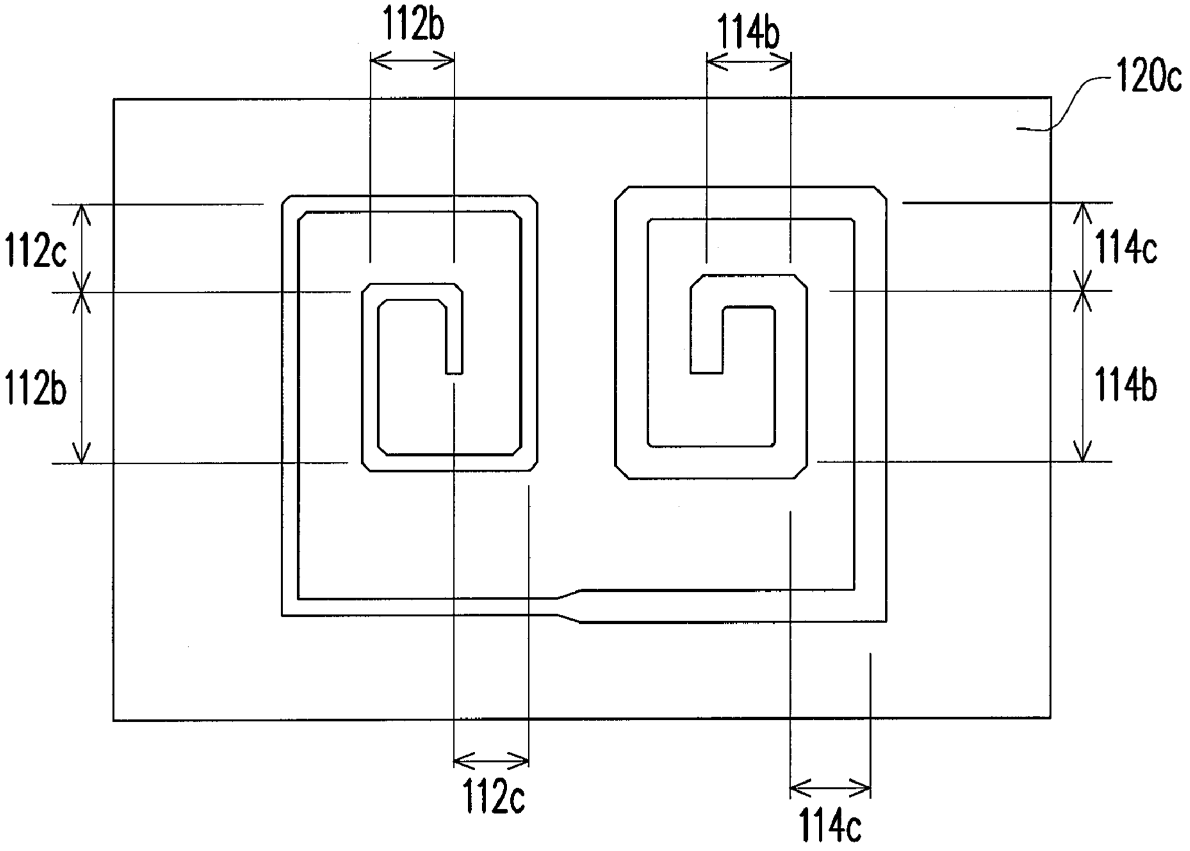
FIG. 1C (PRIOR ART)
FIG. 1C is a schematic top view of a third metallic layer of FIG. 1B.
Figure 2A:
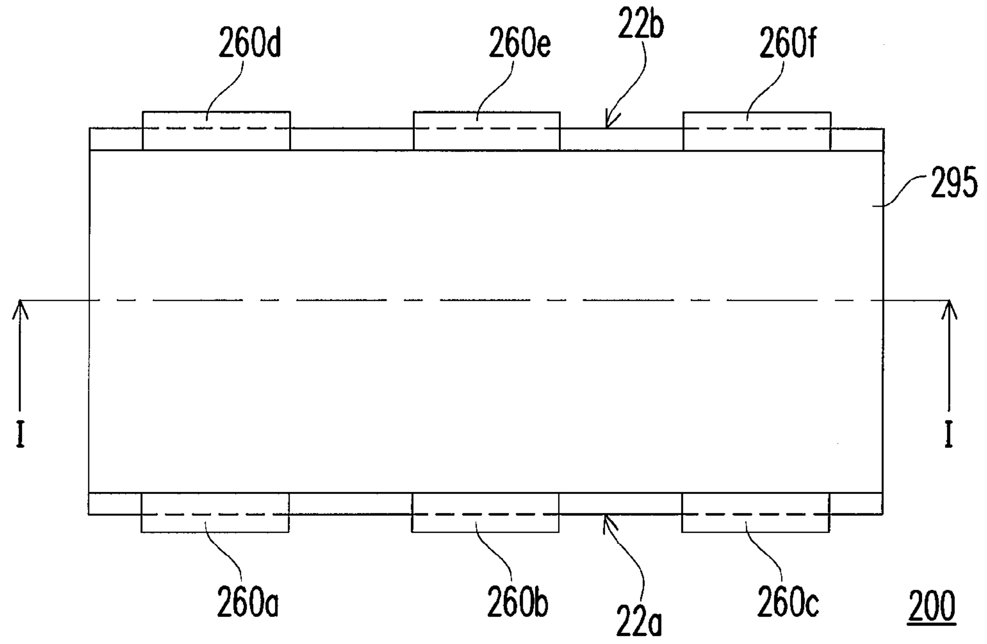
FIG. 2A is a schematic top view of a balun according to a first embodiment of the present invention.
Figure 2B:
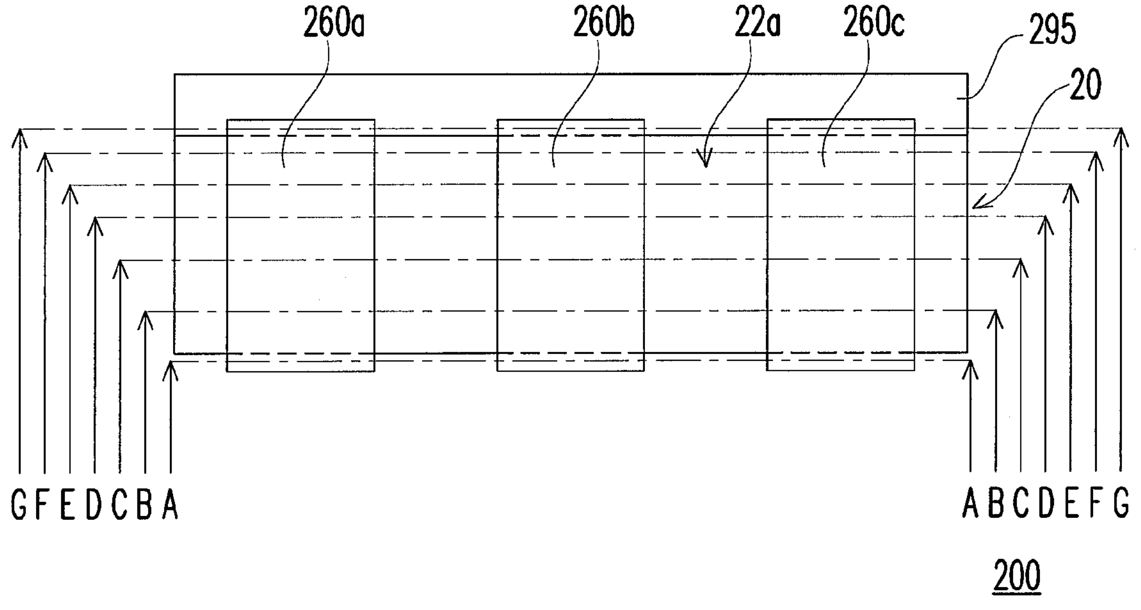
FIG. 2B is a schematic side view of the balun according to the first embodiment of the present invention.

Because the first metallic layer, the second metallic layer, the third metallic layer, the fourth metallic layer, the first dielectric layer, and the second dielectric layer are fabricated by thin film processing, the body 20 has a smaller thickness comparing with the conventional thin layer laminate 100*a* (as shown in FIG. 1B). Further, each metallic layer does not demand for an independent dielectric substrate and thus the body 20 employs fewer layers. As such the balun 200 of the current embodiment has a smaller size. Specifically, according to the method for fabricating the conventional thin layer laminate 100*a*, four dielectric layers including dielectric substrates 120*a*, 120*b*, 120*c*, 120*d* are necessary for fabricating the four metallic layers including the earth electrode 110*a*, the connecting electrode 110*b*, the first strip line 110*c*, and the second strip line 110*d*. On the contrary, according to the present invention, only three dielectric layers (i.e., the dielectric substrate 250, the first dielectric layer 240, and the second dielectric layer 290) are used for fabricating the four metallic layers including the first metallic layer 210, the second metallic layer 220, the third metallic layer 230, and the fourth metallic layer 280.

Because the second metallic layer 220 and the third metallic layer 230 are fabricated by thin film processing, the width of each first line segment of the first spiral line, the width of each second line segment of the second spiral line, the width of each third line segment of the third spiral line, and the width of each fourth line segment of the fourth spiral line can be as small as between 15 μm and 30 μm. In comparison, inner lines of a balun fabricated by low-temperature co-fired ceramics (LTCC) processing typically has a width between 50 μm and 75 μm. The balun according to the present invention is thus adapted for a wider signal frequency bandwidth.

Because the first dielectric layer 240 between the second metallic layer 220 and the third metallic layer 230 is fabricated by thin film process, the thickness of the first dielectric layer 240 can be as small as between 8 μm and 12 μm. In comparison, a dielectric layer fabricated by LTCC processing typically has a thickness more than 30 μm. As such, the second metallic layer 220 and the third metallic layer 230 have a better magnetic coupling efficiency. Moreover, the first dielectric layer 240 having a smaller thickness can advantageously improve capacitance of unit area, which allows using shorter spiral line for achieving a same coupling capability. In this concern, the size and production cost of the balun 200 can be reduced.

Because the second metallic layer 220 and the third metallic layer 230 are fabricated by thin film processing, it is convenient to fabricate the arc corner segments. Such arc corner segments introduce less signal loss when transmitting signals.

Figure 7:
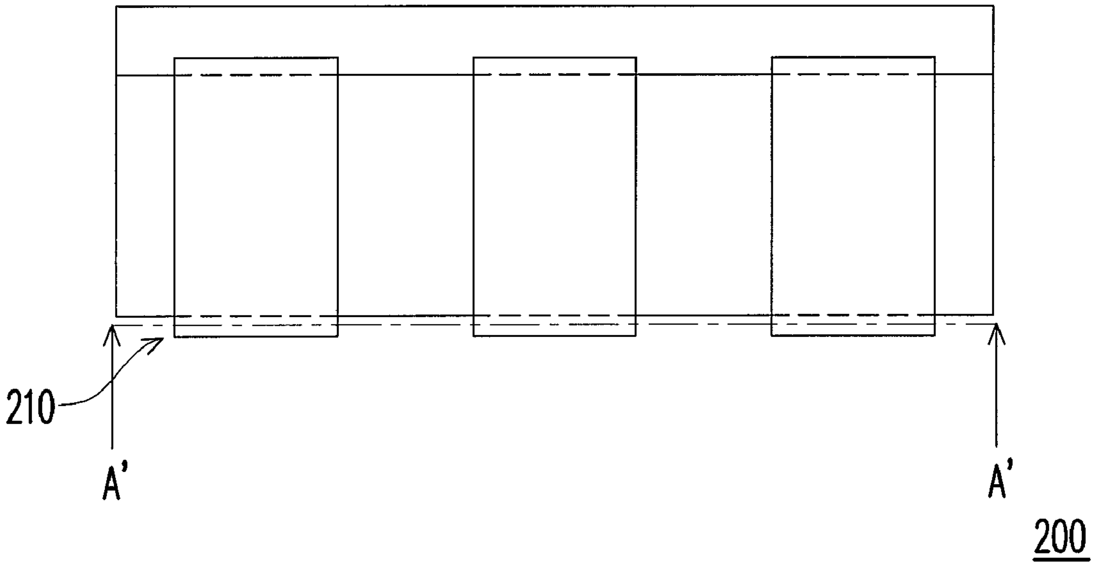
FIG. 7 is a schematic side view of the balun according to the first embodiment in connection with a capacitor.
Figure 8:
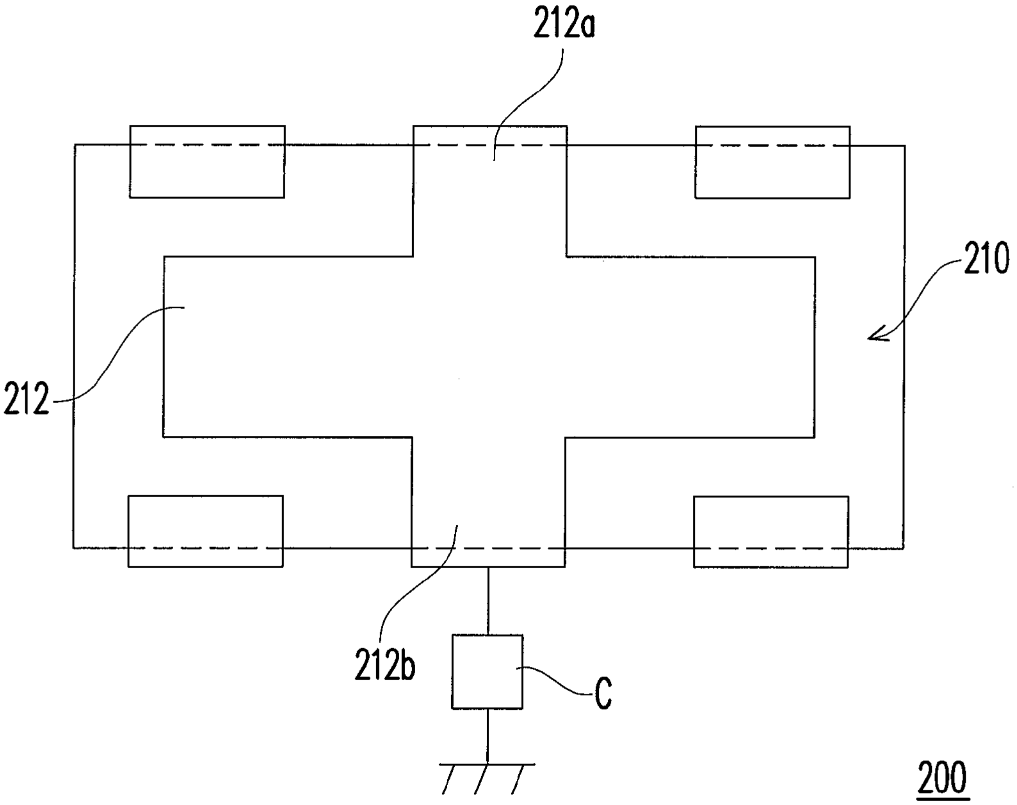
FIG. 8 is a schematic cross-sectional view taken along A'-A' of FIG. 7.
Figure 9:
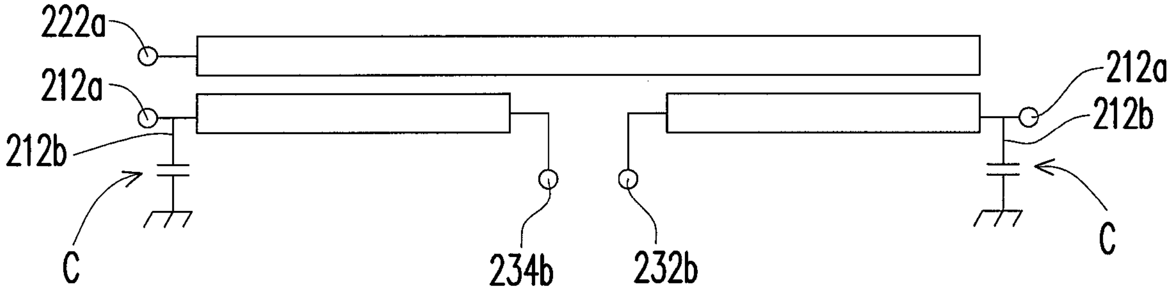
FIG. 9 is an equivalent circuit diagram of the balun of FIG. 7.

When desired for a DC feed function, referring to FIGS. 7, 8, and 9, the balun 200 can be connected with a capacitor C. The first conductive portion 212 of the first metallic layer 210 includes a DC-feed end 212*a* and a fifth connection end 212*b*. The DC-feed end 212*a* is directly connected to the third connection end 232*a* of the third spiral line 232, and the fourth connection end 234*a* of the fourth spiral line 234. One end of the fifth connection end 212*b* is electrically connected between the third connection end 232*a* and the DC-feed end 212*a*, and is electrically connected between the fourth connection end 234*a* and the DC-feed end 212*a*. Another end of the fifth connection end 212*b* is electrically connected to one end of the capacitor C. The other end of the capacitor C is grounded. In such a way, the first metallic layer 210 is grounded via the capacitor C. The DC-feed end 212*a* can be set by the first metallic layer 210, so that when the balun 200 is operated with a control chip, the control chip can be directly supplied with a power supply by the balun 200, and therefore circuit design thereof can be simplified and production cost can be saved.

Second Embodiment

Figure 10:
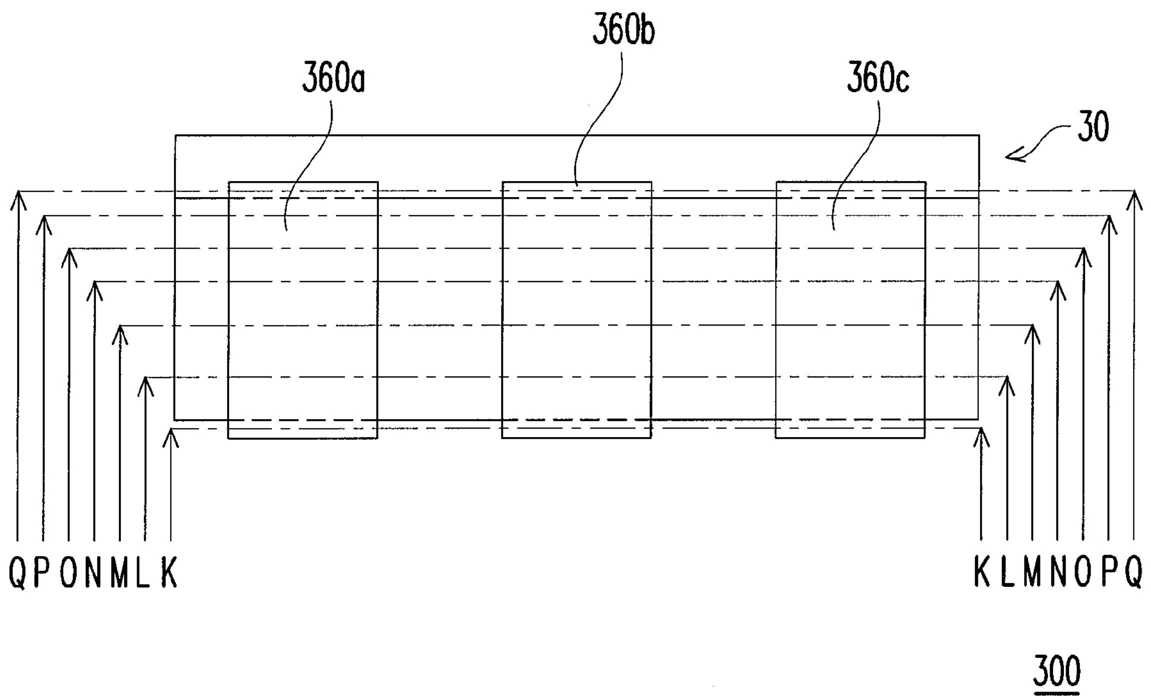
FIG. 10 is a schematic side view of a balun according to a second embodiment of the present invention.
Figure 11A:
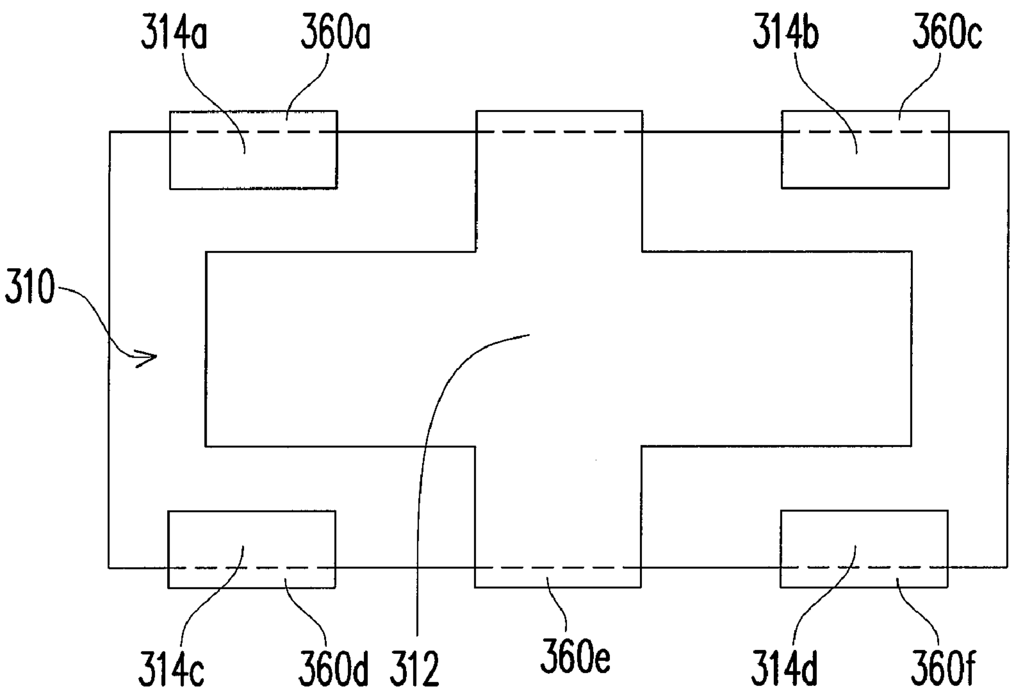
FIGS. 11A through 11G are schematic cross-sectional views taken along lines K-K, L-L, M-M, N-N, O-O, P-P, and Q-Q of FIG. 10, respectively.
Figure 11B:
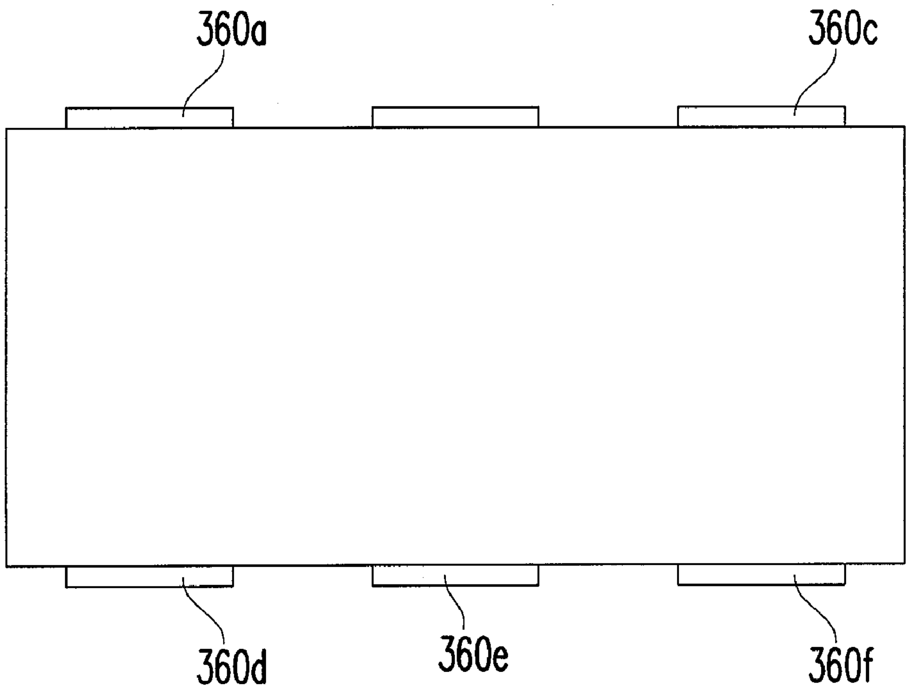
Figure 11C:
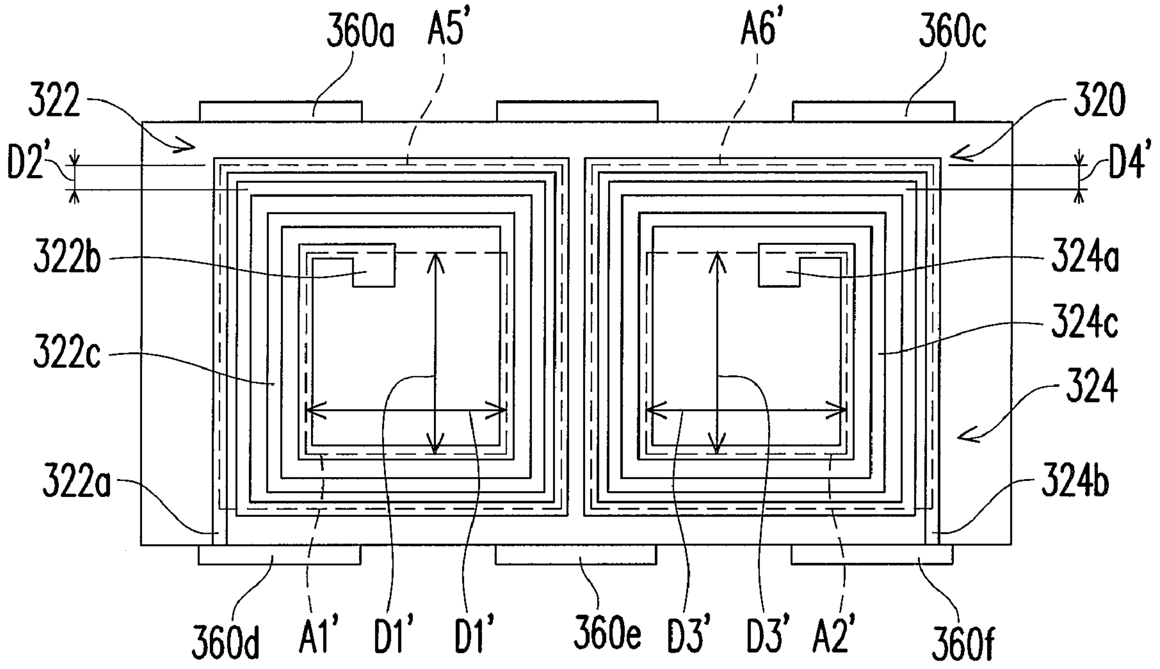
Figure 11D:
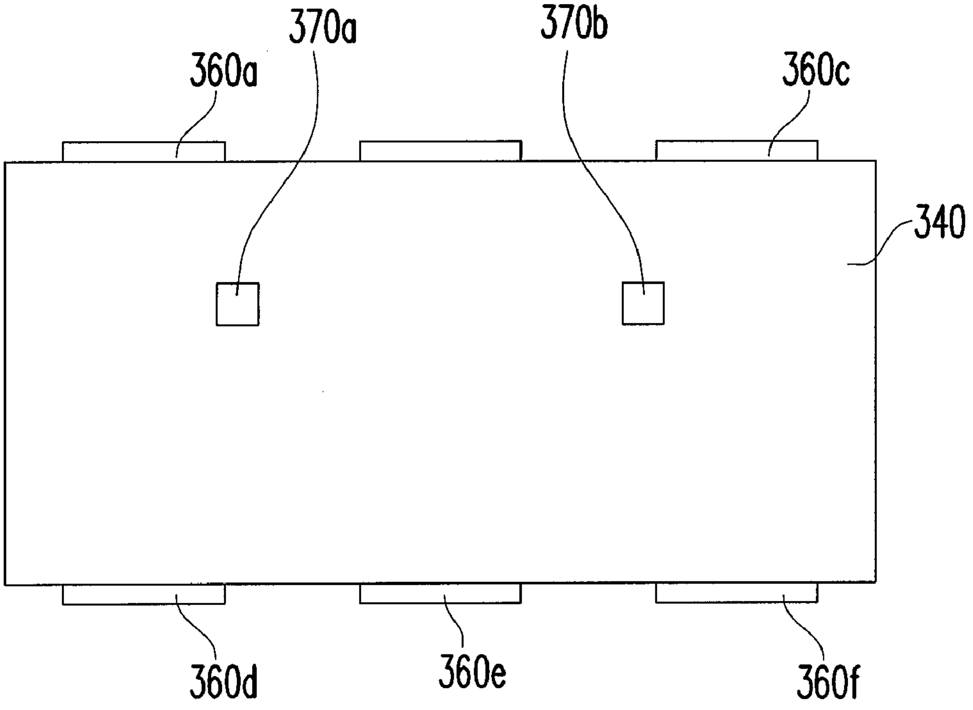
Figure 11E:
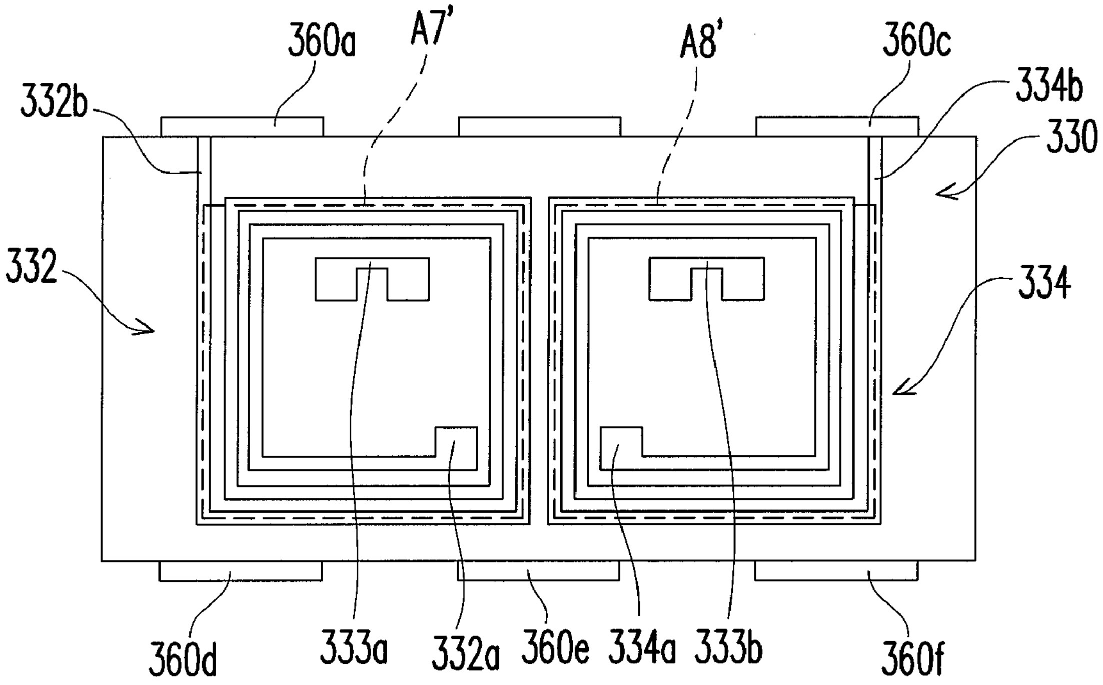
Figure 11F:
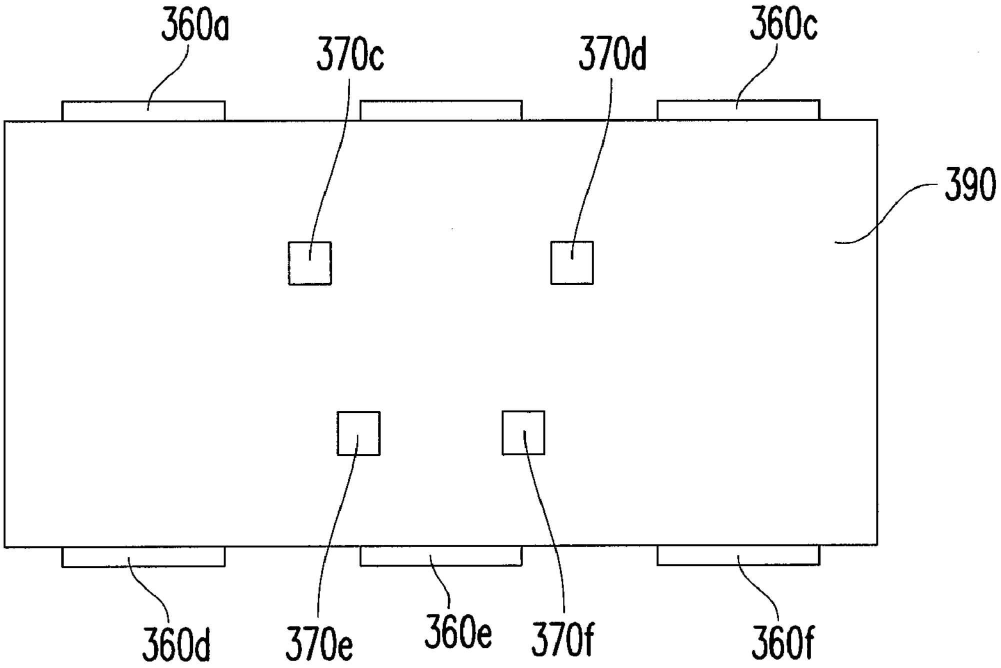
Figure 11G:
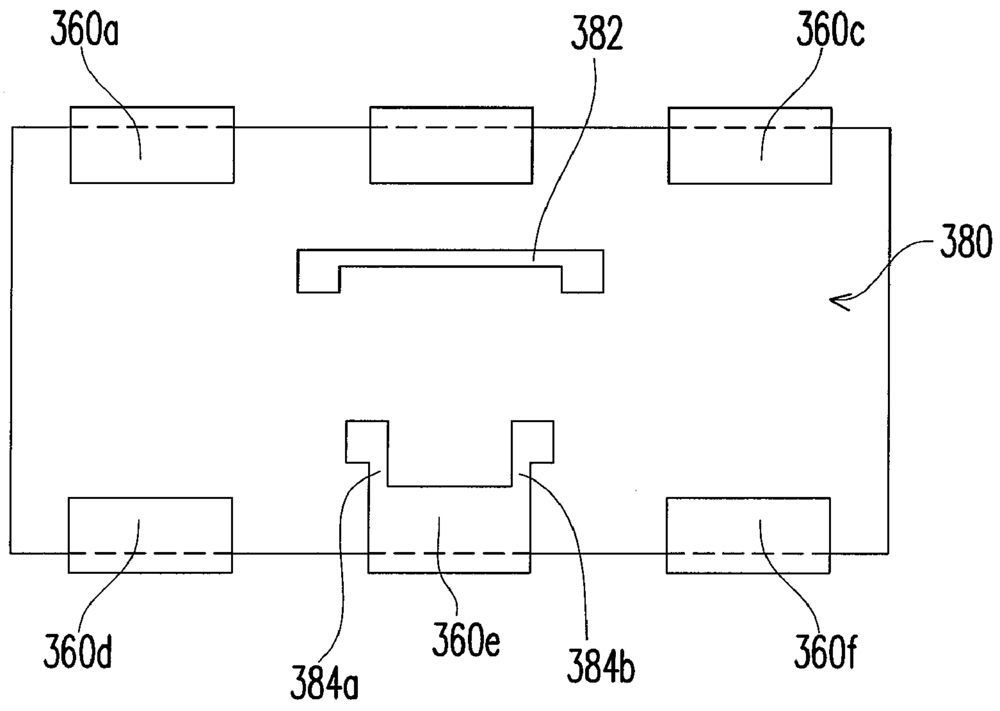

Referring to FIGS. 10, 11C, and 11E, a balun 300 according to a second embodiment of the present invention is shown. The balun 300 differs from the balun 200 according to the first embodiment in that it is configured with different shape of spiral lines, and different electrical connecting positions between external electrodes and the unbalanced I/O end, the balanced I/O ends, and the open-circuit end. In other words, according to the current embodiment, the shapes of the spiral lines are modified because of the electrical connecting positions between external electrodes and the unbalanced I/O end, the balanced I/O ends, and the open-circuit end. Specifically, an outermost circle of a first spiral line 322 of a second metallic layer 320 defines a fifth region A5', and an outermost circle of a second spiral line 324 of the second metal layer 320 defines a sixth region A6'. An outermost circle of a third spiral line 332 of a third metallic layer 330 defines a seventh region A7', and an outermost circle of a fourth spiral line 334 of the third metallic layer 330 defines an eighth region A8'. The fifth region A5', the sixth region A6', the seventh region A7' and the eighth region A8' are configured with square shapes. On the contrary, according to the first embodiment, the fifth region A5, the sixth region A6, the seventh region A7 and the eighth region A8 are configured with rectangular shapes.

Referring to FIGS. 11A through 11G, an unbalanced I/O end 322*a* of the first spiral line 322 is electrically connected to a second conductive portion 314*c* of a first metallic layer 310 via an external electrode 360*d*. A first connection end 322*b* of the first spiral line 322 is electrically connected to a second connection end 324*a* of the second spiral line 324 via a conductive channel 370*a* configured through a first dielectric layer 340, a conductive trace line 333*a* of the second metallic layer 330, a conductive channel 370*c* configured through a second dielectric layer 390, a fifth line segment 382 of a fourth metallic layer 380, a conductive channel 370*d* configured through the second dielectric layer 390, a conductive trace line 333*b* of second metallic layer 330, and a conductive channel 370*b* configured through the first dielectric layer 340. An open-circuit end 324*b* of the second spiral lien 324 is electrically connected to a second conductive portion 314*d* of the first metallic layer 310 via an external electrode 360*f*. The second conductive portion 314*d* is open-circuited. The open-circuit end 324*b* and the unbalanced I/O end 322*a* are connected external electrodes 360*f* and 360*d* respectively, which are disposed at a same side surface (i.e., a second side surface hereby) of a body 30.

A first balanced I/O end 332*b* of the third spiral line 332 is electrically connected to a second conductive portion 314*a* of the first metallic layer 310 via an external electrode 360*a*. A third connection end 332*a* of the third spiral line 332 is electrically connected to a grounded first conductive portion 312 of the first metallic layer 310 via a conductive channel 370*e* configured through the second dielectric layer 390, a sixth line segment 384*a* of the fourth metallic layer 380, and an external electrode 360*e*. A second balanced I/O end 334*b* of the fourth spiral line 334 is electrically connected to a second conductive portion 314*b* of the first metallic layer 310 via an external electrode 360*c*. The second balanced I/O end 334*b* and the first balanced I/O end 332*b* are connected to the external electrodes 360*c*, 360*a* respectively, which are disposed at a same side surface (a first side surface hereby) of the body 30. A fourth connection end 334*a* of the fourth spiral line 334 is electrically connected to the grounded first conductive portion 312 of the first metallic layer 310 via a sixth line segment 384*b* of the fourth metallic layer 380 and the external electrode 360*e*.

Further, the innermost first line segments 322*c* of the first spiral line 322 encircle a first region A1'. Each two opposite sides of the first region A1' are apart from each other for a first distance D1'. Each two adjacent parallel first line segments 322*c* are apart from each other for a second distance D2'. Each second distance D2' is smaller than each first distance D1'. The innermost first line segments 324*c* of the second spiral line 324 encircle a second region A2'. Each two opposite sides of the second region A2' are apart from each other for a third distance D3'. Each two adjacent parallel first line segments 324*c* are apart from each other for a fourth distance D4'. Each fourth distance D4' is smaller than each third distance D3'.

Figure 12:
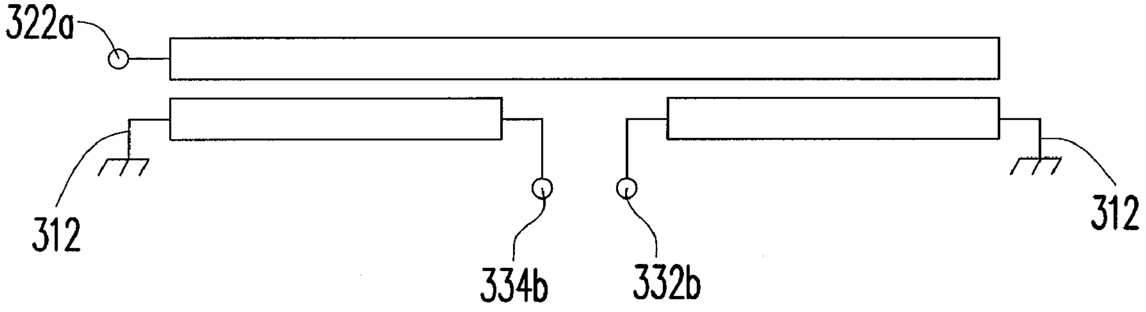
FIG. 12 is an equivalent circuit diagram of the balun according to the second embodiment of the present invention.
Figure 13:
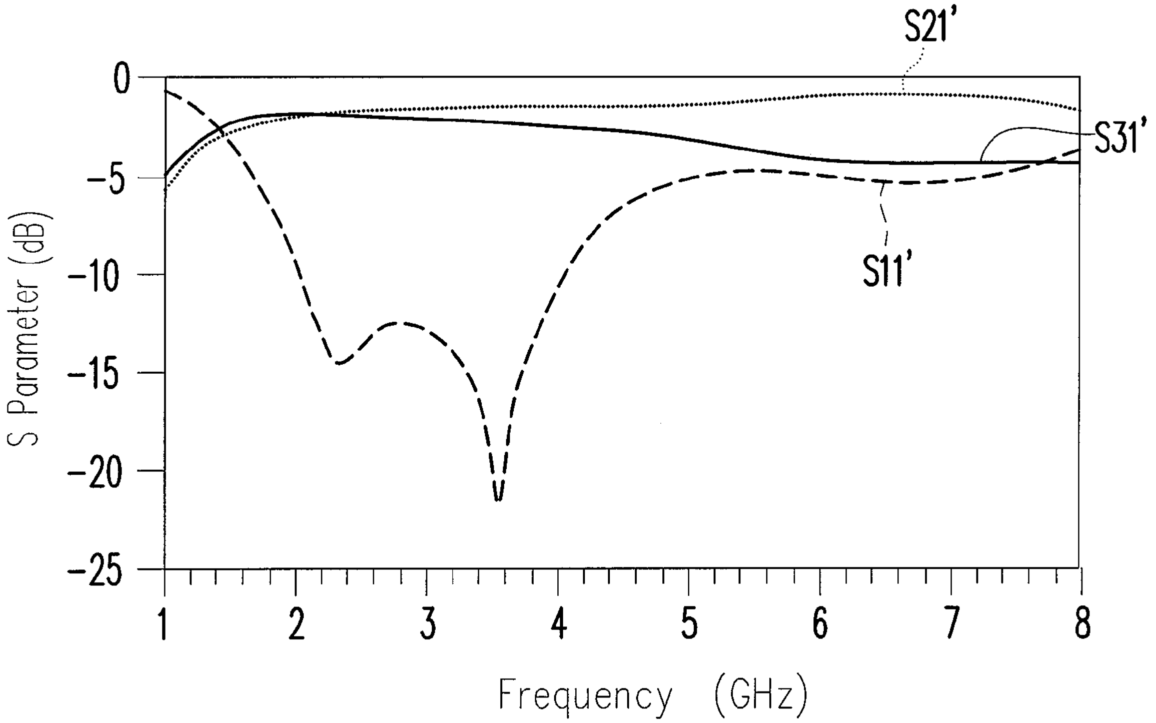
FIG. 13 is a diagram illustrating a frequency vs. S factor relationship when the balun of the second embodiment is in operation.

Referring to FIGS. 12 and 13, for convenience of illustration, the unbalanced I/O end 322*a* is taken as an input end, and the first balanced I/O end 332*b* and the second balanced I/O end 334*b* are taken as output ends. S11' represents a return loss, and S21', S31' represent insertion losses. Specifically, S11' represents a logarithm value of a reflective power measured from the unbalanced I/O end 322*a* divided by an input power measured therefrom, that is log (reflective power of the unbalanced I/O end 322*a*/input power of the unbalanced I/O end 322*a*). S21' represents a logarithm value of an output power measured from the second balanced I/O end 334*b* divided by the input power measured from the unbalanced I/O end 322*a*, that is log (output power of the second balanced I/O end 334*b*/input power of the unbalanced I/O end 322*a*). S31' represents a logarithm value of an output power measured from the first balanced I/O end 332*b* divided by the input power measured from the unbalanced I/O end 322*a*, that is log (output power of the first balanced I/O end 332*b*/input power of the unbalanced I/O end 322*a*). It can be learnt from FIG. 13, within a frequency bandwidth range from 2.2 GHz to 3.6 GHz, S11' is more farther from 0 than other frequency bandwidth ranges, and S21', S31' are more approximate to 0 than other frequency bandwidth ranges. As such, within the frequency bandwidth range from 2.2 GHz to 3.6 GHz, the unbalanced I/O end 322*a* has a better return loss performance, and the balanced I/O ends 332*b*, 334*b* has a better insertion loss performance. It is so because each second distance D2' is smaller than each first distance D1', and each fourth distance D4' is smaller than each third distance D3', so that the return loss of the unbalanced I/O end 322*a* is decreased, the insertion loss of the first balanced I/O end 332*b* relative to the unbalanced I/O end 322*a* is decreased, and the insertion loss of the second balanced I/O end 334*b* relative to the unbalanced I/O end 322*a* is decreased. Further, the balun 300 according to the embodiment of the present invention has an optimal quality factor Q. Generally, comparing with the conventional technologies, the balun 300 of the current embodiment has an improved electrical performance.

It should be noted that the balun 300 of the second embodiment can also be connected with a capacitor as same as the first embodiment. The electrical connection can be learnt by referring to the discussion of the first embodiment, and is not iterated hereby.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A balun, comprising:

a first metallic layer, having a first conductive pattern;

a second metallic layer, comprising:

a first spiral line, comprising an unbalanced I/O end and a first connection end; and a second spiral line, comprising a second connection end and an open-circuit end;

a third metallic layer, comprising:

a third spiral line, corresponding to the first spiral line and comprising a third connection end electrically connected to the first conductive pattern, and a first balanced I/O end; and a fourth spiral line, corresponding to the second spiral line and comprising a fourth connection end electrically connected to the first conductive pattern, and a second balanced I/O end;

a first dielectric layer, disposed between the second metallic layer and the third metallic layer;

a fourth metallic layer, via which the first connection end is electrically connected to the second connection end;

a second dielectric layer, disposed between the third metallic layer and the fourth metallic layer; and a dielectric substrate, having a first surface and a second surface opposite one to another, wherein the first metallic layer is disposed on the first surface by thin film processing, and the second metallic layer, the third metallic layer, the first dielectric layer, the fourth metallic layer and the second dielectric layer are disposed on the second surface by thin film processing.

2. The balun according to claim 1, wherein the first spiral line further comprises a plurality of sequentially connected first line segments, wherein the innermost first line segments encircle a first region; each two opposite sides of the first region are apart from each other for a first distance; each two adjacent parallel first line segments are apart from each other for a second distance; and each second distance is smaller than each first distance; and the second spiral line further comprises a plurality of sequentially connected second line segments, wherein the innermost second line segments encircle a second region; each two opposite sides of the second region are apart from each other for a third distance; each two adjacent parallel second line segments are apart from each other for a fourth distance; and each fourth distance is smaller than each third distance.

3. The balun according to claim 2, wherein each of the first line segments has a width between 15 μm and 30 μm, and each of the second line segments has a width between 15 μm and 30 μm.

4. The balun according to claim 2, wherein the first spiral line further comprises a plurality of first arc corner segments, each of the first arc corner segments connecting two of the first line segments; and the second spiral line further comprises a plurality of second arc corner segments, each of the second arc corner segments connecting two of the second line segments.

5. The balun according to claim 1, wherein the third spiral line comprises a plurality of sequentially connected first line segments, wherein the innermost first line segments encircle a first region; each two opposite sides of the first region are apart from each other for a first distance; each two adjacent parallel first line segments are apart from each other for a second distance; and each second distance is smaller than each first distance; and the fourth spiral line comprises a plurality of sequentially connected second line segments, wherein the innermost second line segments encircle a second region; each two opposite sides of the second region are apart from each other for a third distance; each two adjacent parallel second line segments are apart from each other for a fourth distance; and each fourth distance is smaller than each third distance.

6. The balun according to claim 5, wherein each of the first line segments has a width between 15 μm and 30 μm, and each of the second line segments has a width between 15 μm and 30 μm.

7. The balun according to claim 5, wherein the third spiral line further comprises a plurality of first arc corner segments, each of the first arc corner segments connecting two of the first line segments; and the fourth spiral line further comprises a plurality of second arc corner segments, each of the second arc corner segments connecting two of the second line segments.

8. The balun according to claim 1, wherein the first dielectric layer has a thickness between 8 μm and 12 μm.

9. The balun according to claim 1, wherein the fourth metallic layer comprises a first line segment and a plurality of second line segments; the first connection end of the first spiral line is electrically connected to the second connection end of the second spiral line via the first line segment; the third spiral line is electrically connected to the first conductive pattern via one of the second line segments; and the fourth spiral line is electrically connected to the first conductive pattern via another one of the second line segments.

10. The balun according to claim 1, wherein the first metallic layer is made of copper (Cu).

11. The balun according to claim 1, wherein the second metallic layer includes a first sub-metallic layer made of copper (Cu), and a second sub-metallic layer made of nickel-chromium (Ni—Cr) alloy; the third metallic layer comprises a third sub-metallic layer made of Cu, and a fourth sub-metallic layer made of Ni—Cr alloy.

12. The balun according to claim 1, wherein an outermost circle of the first spiral line defines a first region; an outermost circle of the second spiral line defines a second region; an outermost circle of the third spiral line defines a third region; an outermost circle of the fourth spiral line defines a fourth region, wherein the first region, the second region, the third region, and the fourth region are configured with rectangular shapes.

13. The balun according to claim 1, wherein an outermost circle of the first spiral line defines a first region; an outermost circle of the second spiral line defines a second region; an outermost circle of the third spiral line defines a third region; an outermost circle of the fourth spiral line defines a fourth region, wherein the first region, the second region, the third region, and the fourth region are configured with square shapes.

14. The balun according to claim 1, wherein the first conductive pattern is grounded.

15. The balun according to claim 1, wherein the first conductive pattern comprises a direct current (DC) feed-in end and a fifth connection end, wherein the fifth connection end is electrically connected to an end of a capacitor, and the other end of the capacitor is grounded.

16. The balun according to claim 1, wherein the first metallic layer comprises a plurality of second conductive patterns which are disposed apart from the first conductive pattern, where the unbalanced I/O end is electrically connected to one of the second conductive patterns, the first balanced I/O end is electrically connected to another one of the second conductive patterns, and the second balanced I/O end is electrically connected to still another one of the second conductive patterns.

17. The balun according to claim 1, wherein the first metallic layer comprises a plurality of second conductive patterns which are disposed apart from the first conductive pattern, and the open-circuit end is electrically connected to one of the second conductive patterns.

18. The balun according to claim 1, wherein the dielectric substrate is made of alumina.

19. The balun according to claim 1, further comprising a plurality of external electrodes disposed on a first side surface.

20. A method for manufacturing a balun, comprising the steps of:

providing a dielectric substrate, wherein the dielectric substrate has a first surface and a second surface opposite one to another;

forming a first metallic layer, wherein the first metallic layer comprises:

a first spiral line, comprising an unbalanced I/O end and a first connection end; and a second spiral line, comprising a second connection end and an open-circuit end;

forming a first dielectric layer on the first metallic layer;

forming a second metallic layer on the first dielectric layer, wherein the second metallic layer comprises:

a third spiral line, corresponding to the first spiral line and comprising a third connection end and a first balanced I/O end; and a fourth spiral line, corresponding to the second spiral line and comprising a fourth connection end and a second balanced I/O end;

forming a second dielectric layer on the second metallic layer;

forming a third metallic layer on the second dielectric layer, wherein the first connection end is electrically connected to the second connection end via the third metallic layer; and forming a fourth metallic layer, wherein the fourth metallic layer has a first conductive portion;

wherein the third connection end is electrically connected to the first conductive portion, and the fourth connection end is electrically connected to the first conductive portion;

wherein the fourth metallic layer is disposed on the first surface by thin film processing, and the first metallic layer, the second metallic layer, the first dielectric layer, the third metallic layer and the second dielectric layer are disposed on the second surface by thin film processing.

* * * * *